(12) United States Patent
Zayic et al.

(10) Patent No.: US 9,245,063 B2
(45) Date of Patent: Jan. 26, 2016

(54) CREATING ERGONOMIC MANIKIN POSTURES AND CONTROLLING COMPUTER-AIDED DESIGN ENVIRONMENTS USING NATURAL USER INTERFACES

(71) Applicant: The Boeing Company, Chicago, IL (US)

(72) Inventors: Jerry Dean Zayic, Renton, WA (US); Bruce L. Nelson, Woodinville, WA (US)

(73) Assignee: THE BOEING COMPANY, Chicago, IL (US)

( * ) Notice: Subject to any disclaimer, the term of this patent is extended or adjusted under 35 U.S.C. 154(b) by 168 days.

(21) Appl. No.: 13/857,914

(22) Filed: Apr. 5, 2013

(65) Prior Publication Data

US 2014/0303937 A1    Oct. 9, 2014

(51) Int. Cl.
G06F 17/50 (2006.01)
G06F 19/12 (2011.01)

(52) U.S. Cl.
CPC .................................. *G06F 17/50* (2013.01)

(58) Field of Classification Search
CPC .. G06F 17/5009; G06F 17/50; G06F 11/3457
USPC ........................ 703/13, 21–22, 1, 6
See application file for complete search history.

(56) References Cited

U.S. PATENT DOCUMENTS

| 6,384,819 B1 * | 5/2002 | Hunter ........................... 345/418 |
| 2005/0151850 A1 * | 7/2005 | Ahn et al. ................. 348/207.99 |
| 2010/0030532 A1 * | 2/2010 | Arora et al. ....................... 703/2 |

OTHER PUBLICATIONS

Westfeld et al. "Automatic techniques for 3D reconstruction of critical workplace body postures from range imaging data", 2013 International Society for Photogrammetry and Remote Sensing, Inc. (ISPRS) Published by Elsevier B.V., pp. 56-65.*
Lee et al. "Interactive Control of Avatars Animated with Human Motion Data", the Association for Computing Machinery, Inc., 2002 ACM 1-58113-521-1/02/0007, 2002, pp. 491-500.*
Westfeld et al. "Range Image Sequence Analysis by 2.5-D Least Squares Tracking with Variance Component Estimation and Robust Variance Covariance Matrix Estimation", The International Archives of the Photogrammetry, Remote Sensing and Spatial Information Sciences, vol. XXXVII, Part B5, Beijing 2008, pp. 933-938.*
Kakadiaris et al. "Model-based estimation of 3D human motion", IEEE Transactions on Pattern Analysis and Machine intelligence, vol. 22, No. 12, Dec. 2000, pp. 1453-1459.*

(Continued)

*Primary Examiner* — Omar Fernandez Rivas
*Assistant Examiner* — Shiuh-Huei Ku
(74) *Attorney, Agent, or Firm* — Yee & Associates, P.C.

(57) ABSTRACT

A computer receives a set of spatial coordinates from a motion-sensing input device, the spatial coordinates describing a position of at least one joint of a limb of a human model. The computer sends the set of spatial coordinates to a computer-aided design application, the computer-aided design application representing movements of the ergonomic manikin based on changes in limb angles described by a plurality of instances of angle data. The computer receives angle specifications from a computer-aided design application, the angle specifications corresponding to an angle of the limb in at least one three-dimensional plane. The computer converts the set of spatial coordinates to angle data in accordance with the received angle specifications, the angle data describing positioning of the limb.

20 Claims, 20 Drawing Sheets

(56) References Cited

OTHER PUBLICATIONS

Westfeld et al. "Range image sequence analysis by 2.5-D least squares tracking with variance component estimation and robust variance covariance matrix estimation", Proceedings of the International Archives of the Photogrammetry, Remote Sensing and Spatial Information Sciences, Beijing, China, Sep. 14-16, pp. 457-462.*

Lee et al. "Interactive Control of Avatars Animated with Human Motion Data", the Association for Computer Machinery, Inc., 2002 ACM 1-58113-521-1/02/0007, 2002, pp. 491-500.*

"Siemens PLM: Improving Workplace Environments with Kinect and Jack," Microsoft Corporation, dated Dec. 5, 2011, 1 page. Retrieved Mar. 26, 2013 from http://blogs.technet.com/b/sql_server_isv/archive/2011/12/05/siemens-plm-improving-workplace-environments-with-kinect-and-jack.aspx.

"Jack and Process Simulate Human—Product Overview," Siemens Product Lifecycle Management Software Inc., copyright 2013, 3 pages. Retrieved Mar. 26, 2013 from https://www.plm.automation.siemens.com/en_us/products/tecnomatix/assembly_planning/jack/#lightview-close.

Extended European Search Report, dated Dec. 22, 2014, regarding Application No. EP14158859.0, 9 pages.

Père et al., "Full body motion capture in CAD environment," Proceedings of Virtual Concept 2006, Nov. 2006, 10 pages.

* cited by examiner

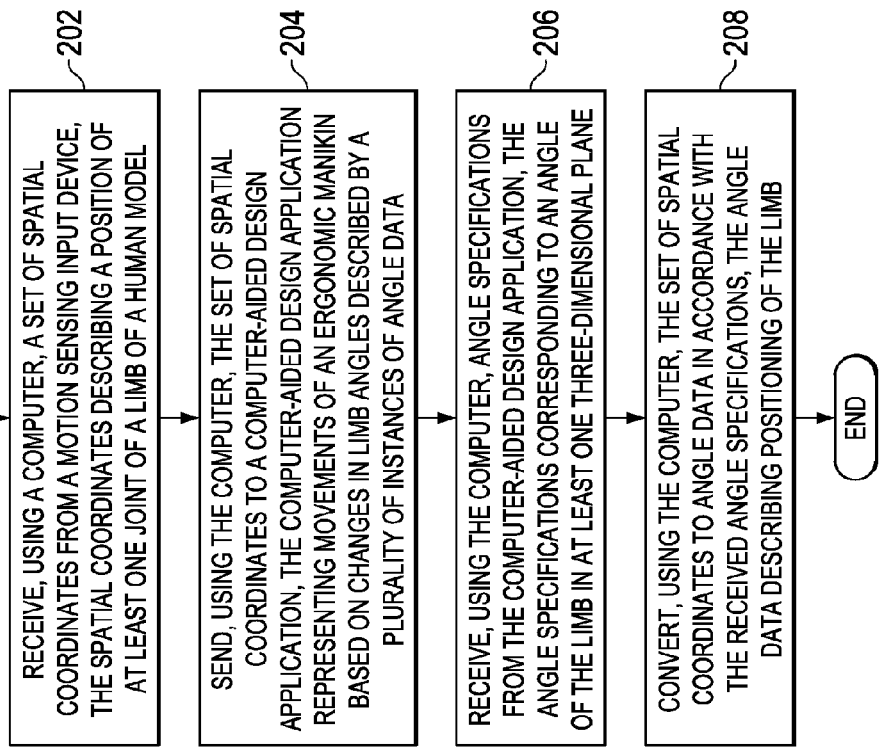
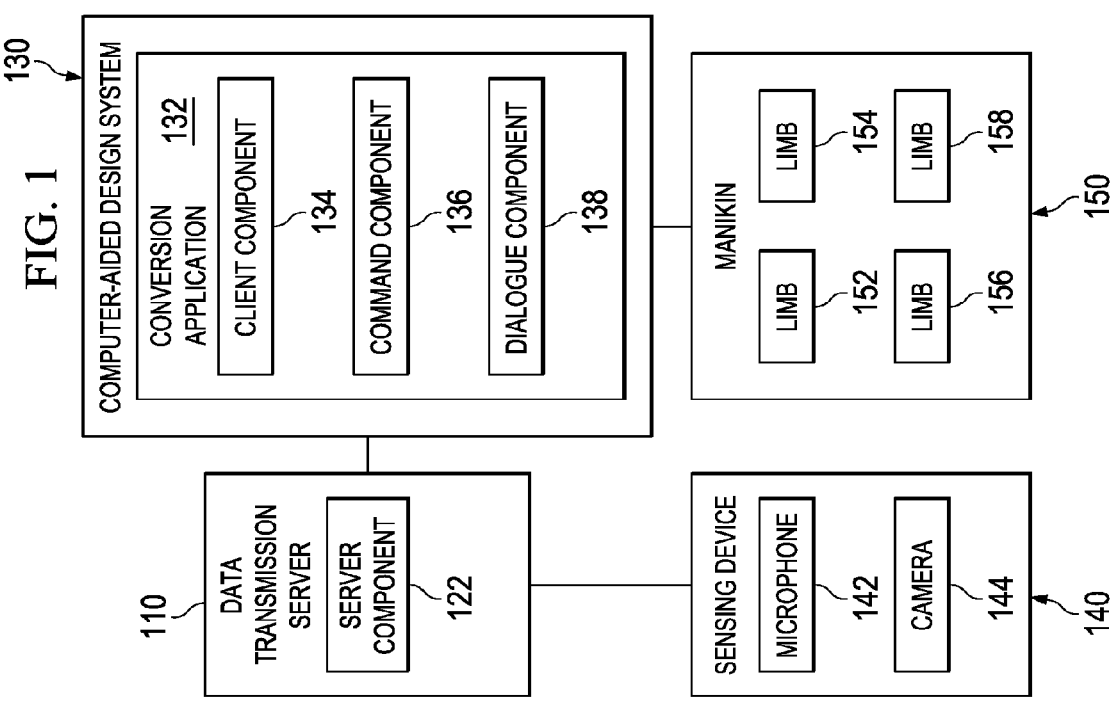

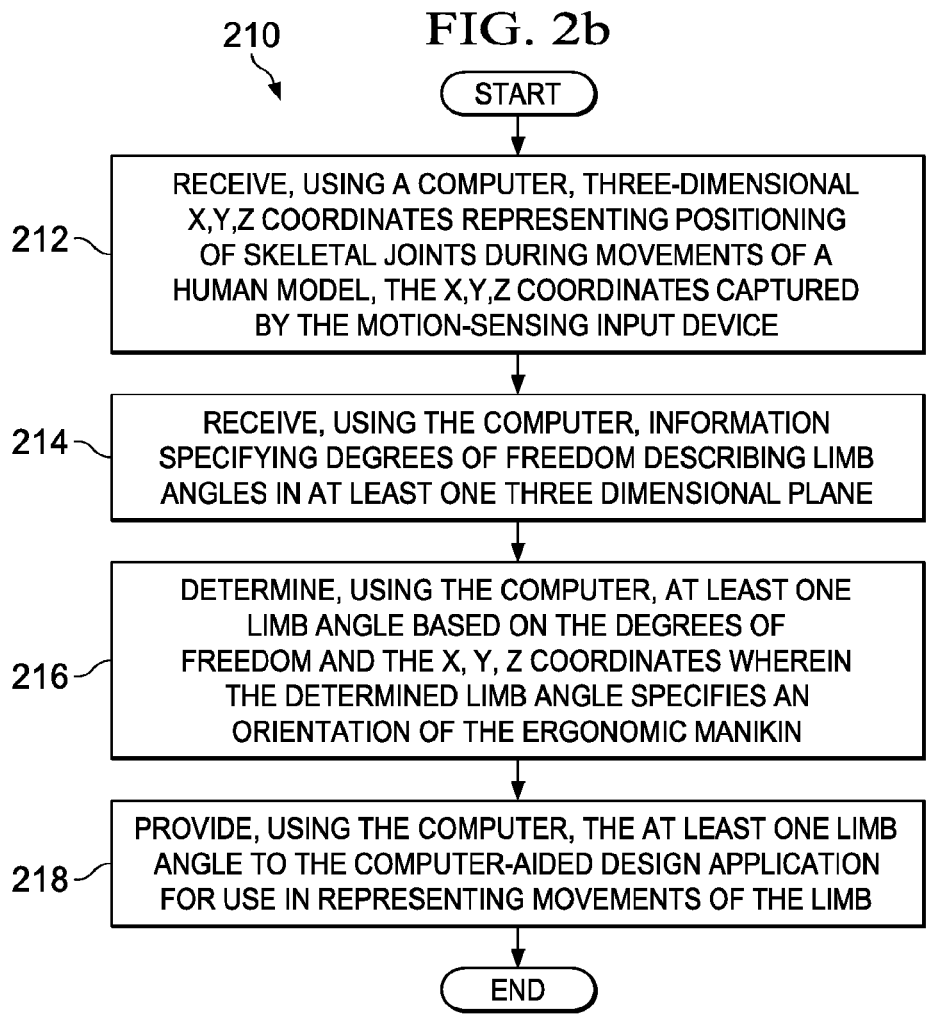
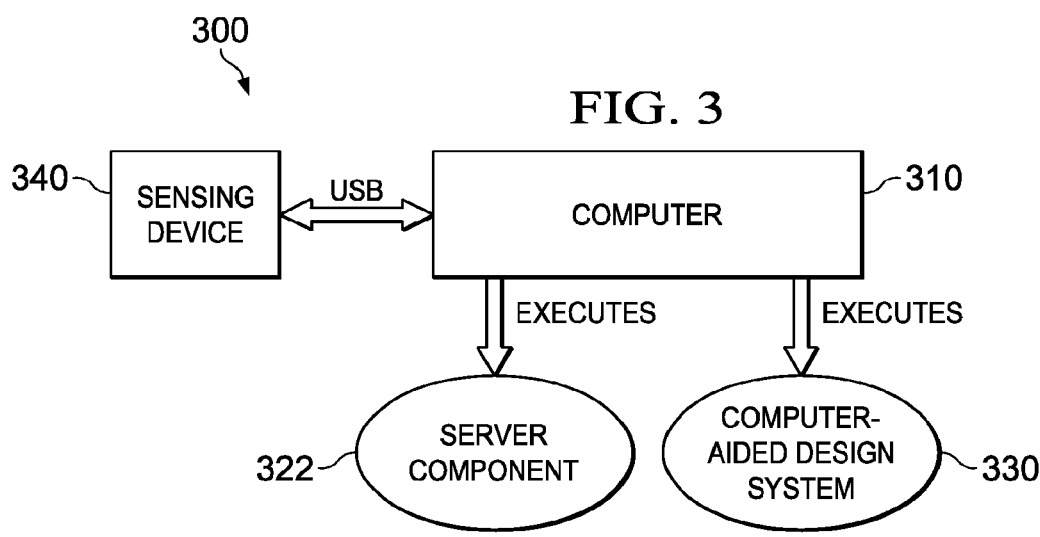

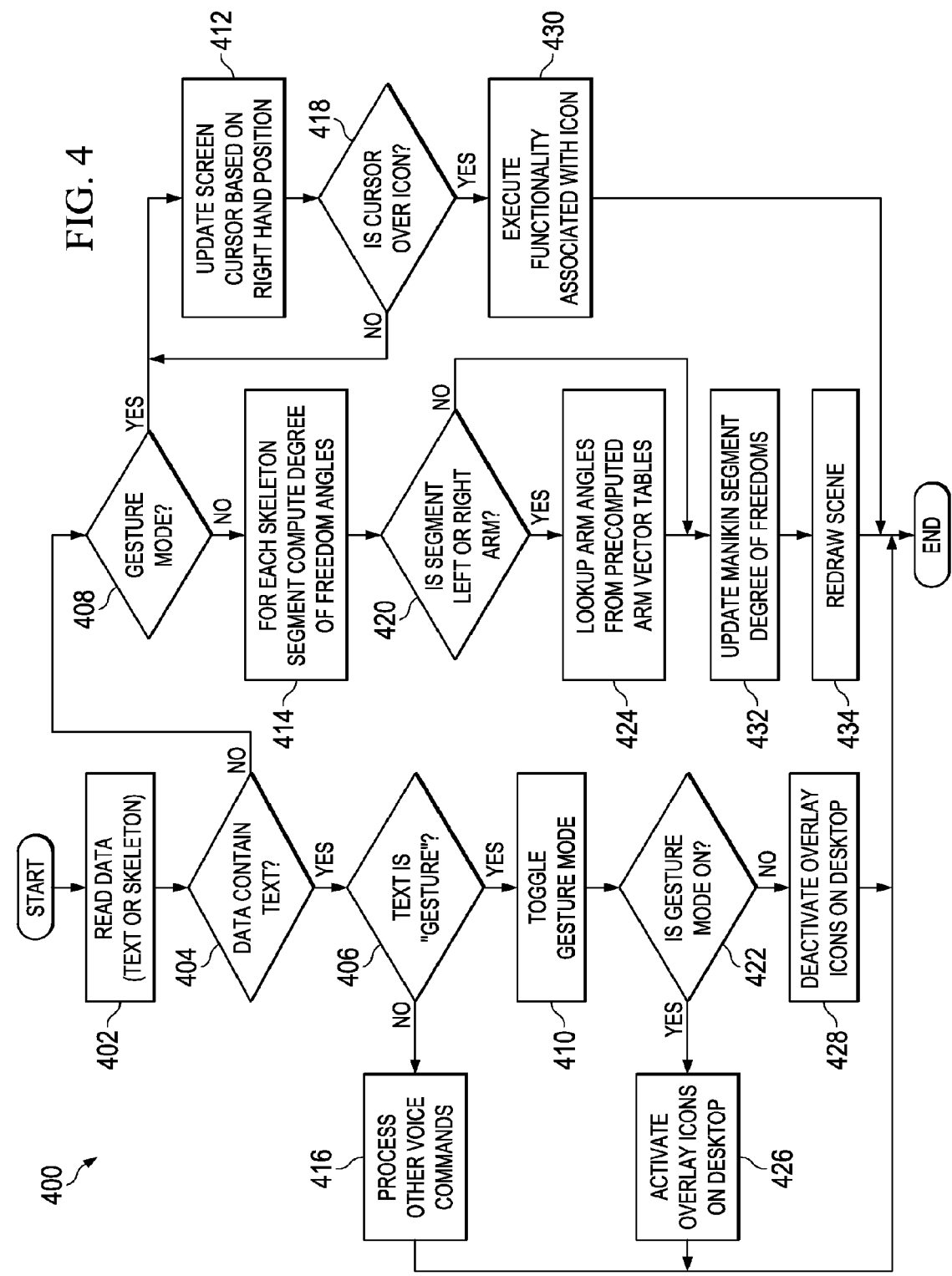

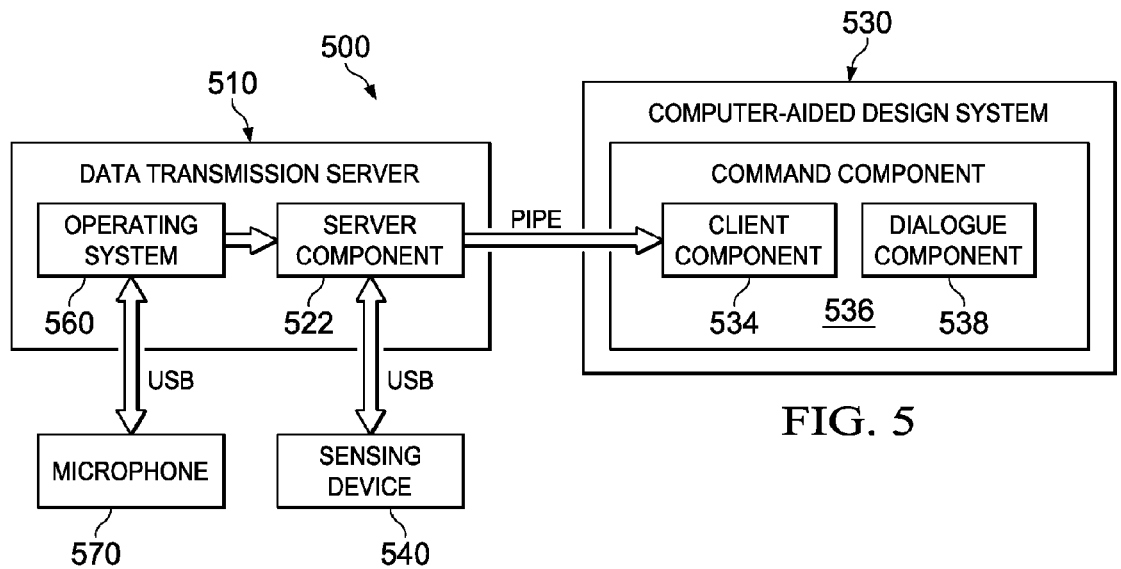
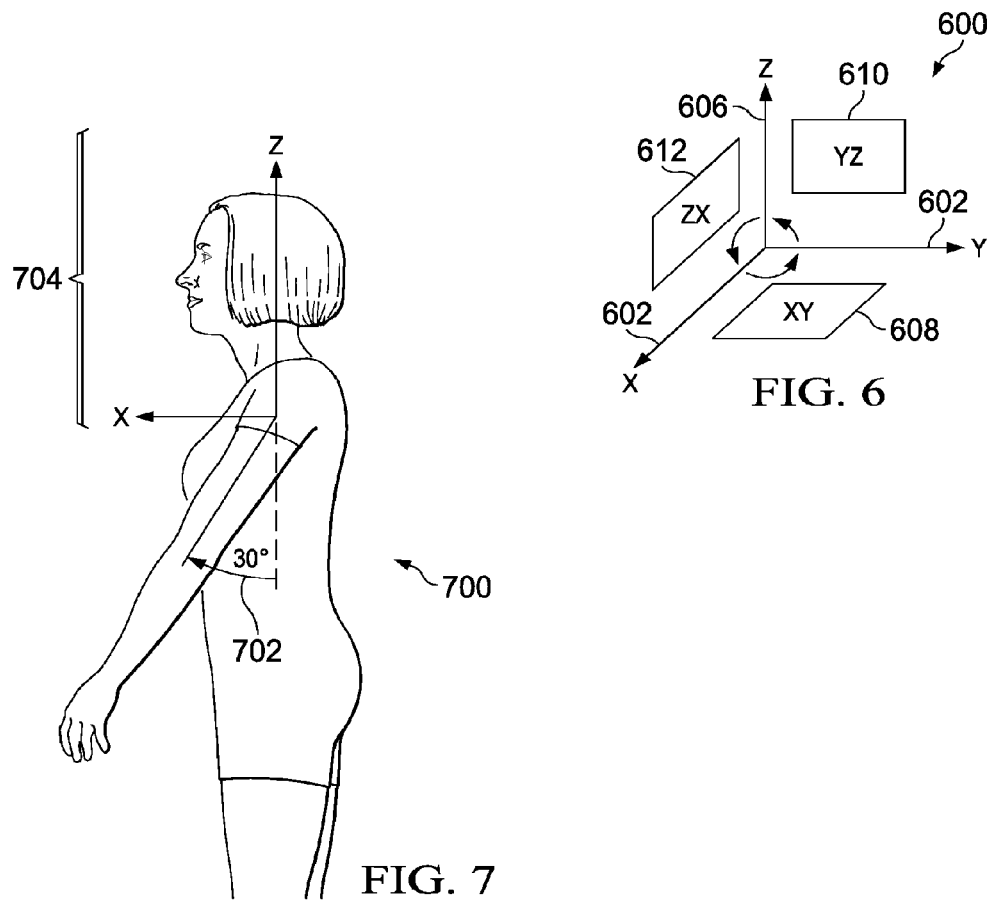

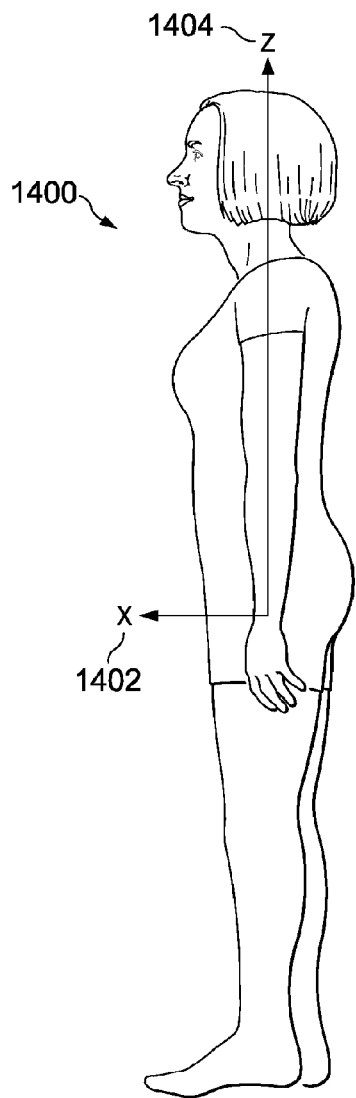
FIG. 14
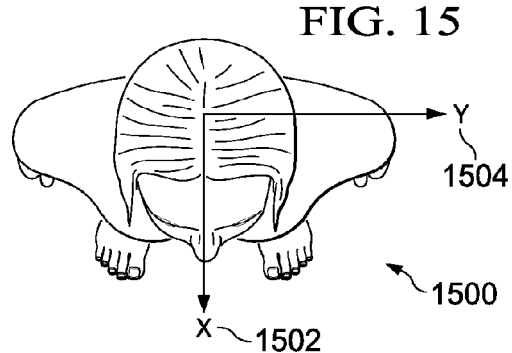
FIG. 15
FIG. 16
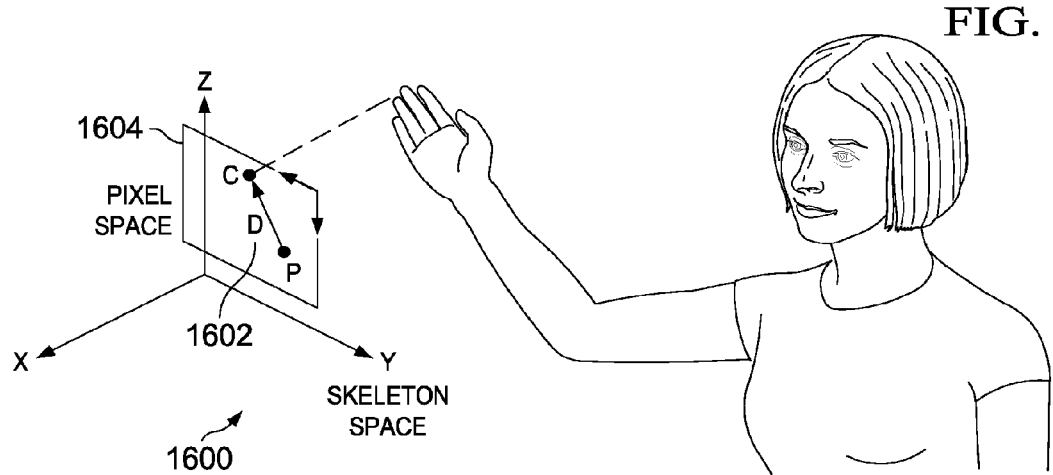

| SEGMENT | 0:ZX | 1:YZ | 2:XY |
|---|---|---|---|
| Head<br>SHOULDER_CENTER TO POSITION_HEAD | | | |
| ArmR<br>SHOULDER_RIGHT TO ELBOW_RIGHT | | | |
| ArmL<br>SHOULDER_LEFT TO ELBOW_LEFT | | | |
| LUMBAR<br>POSITION_SPINE TO SHOULDER_CENTER | | | |

FIG. 19

| SEGMENT | 0:ZX | 1:YZ | 2:XY |
|---|---|---|---|
| ForeArmR<br><br>ELBOW_RIGHT TO WRIST_RIGHT | 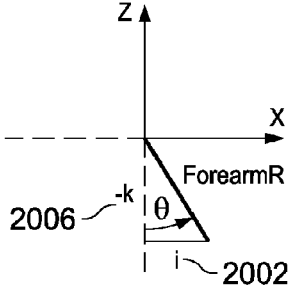 | | |
| ForeArmL<br><br>ELBOW_LEFT TO WRIST_LEFT | 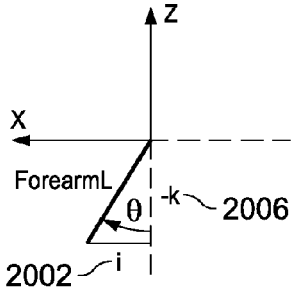 | | |
| ThighR<br><br>HIP_RIGHT TO KNEE_RIGHT | 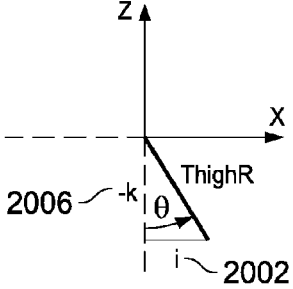 | 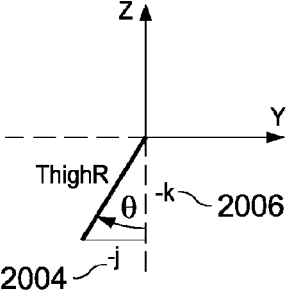 | |
| ThighL<br><br>HIP_LEFT TO KNEE_LEFT | 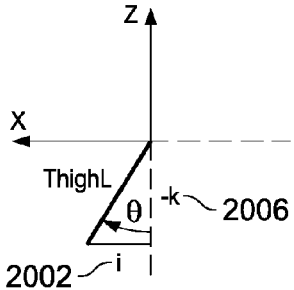 | 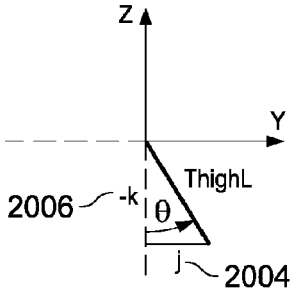 | |
FIG. 20

| SEGMENT | 0:ZX | 1:YZ | 2:XY |
|---|---|---|---|
| LegR<br><br>KNEE_RIGHT<br>TO<br>ANKLE_<br>RIGHT | 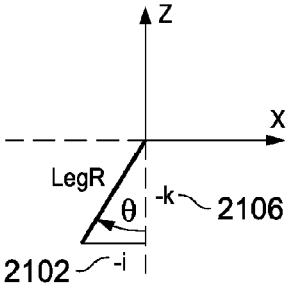 | | |
| LegL<br><br>KNEE_LEFT<br>TO<br>ANKLE_LEFT | 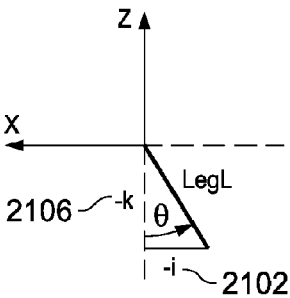 | | |
| HandR<br><br>WRIST_<br>RIGHT TO<br>HAND_RIGHT | 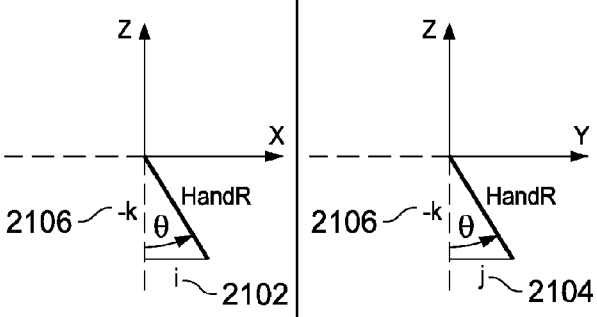 | 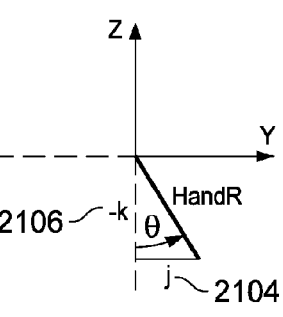 | |
| HandL<br><br>WRIST_LEFT<br>TO<br>HAND_LEFT | 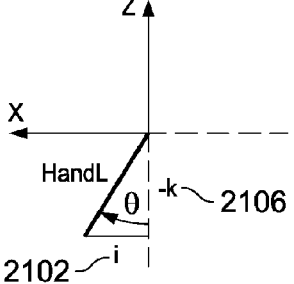 | 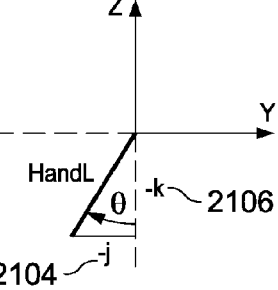 | |
FIG. 21

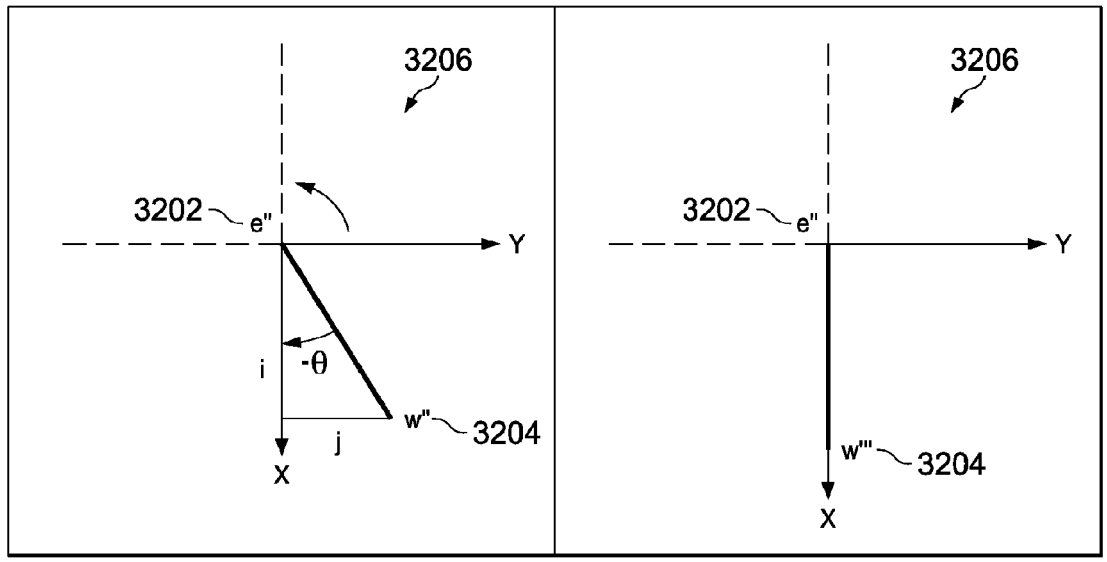
FIG. 32
```
-60.000000, -18.000000, -0.856154, 0.150556, -0.494301
-60.000000, -17.000000, -0.858299, 0.133279, -0.495539
-60.000000, -16.000000, -0.860183, 0.115962, -0.496627
-60.000000, -15.000000, -0.861805, 0.098610, -0.497563
                          .
                          .
                          .
170.000000, 76.000000, 0.014696, 0.079994
170.000000, 77.000000, 0.011082, -0.997961, 0.062851
170.000000, 78.000000, 0.008056, -0.998923, 0.045689
170.000000, 79.000000, 0.005028, -0.999581, 0.028513
```
FIG. 33
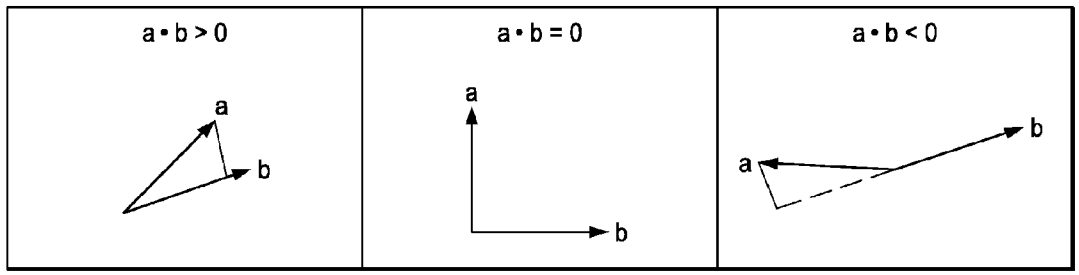
FIG. 34

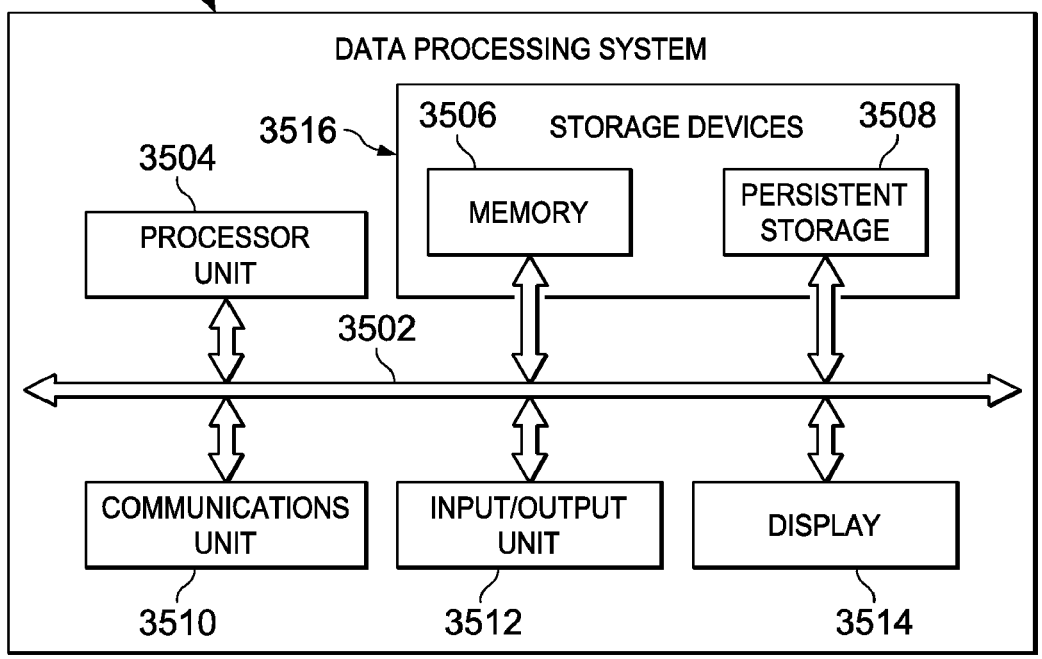
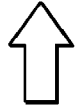
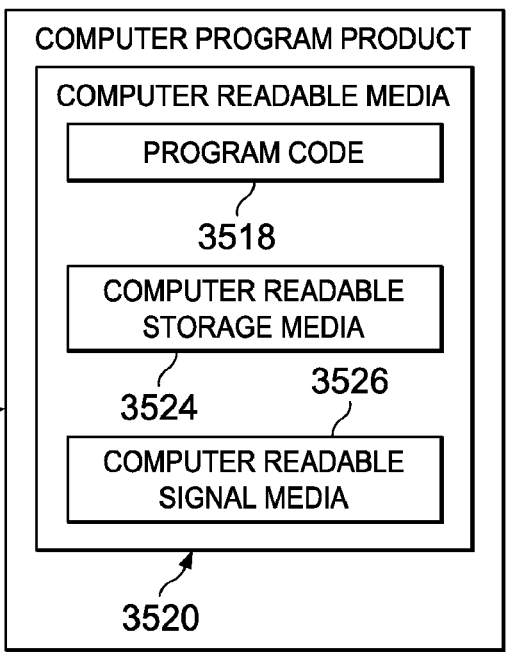
FIG. 35

CREATING ERGONOMIC MANIKIN POSTURES AND CONTROLLING COMPUTER-AIDED DESIGN ENVIRONMENTS USING NATURAL USER INTERFACES

BACKGROUND INFORMATION

1. Field

The present disclosure relates generally to the positioning of ergonomic manikins and controlling their environments and, in particular, to a system and method for positioning structural models and controlling their design environments through the use of motion-sensing devices, algorithms that convert spatial coordinate data to angle data, and computer-aided design systems that create models based on observed motions of an object.

2. Background

Ergonomic manikins are used in a variety of applications including product design, modeling, testing, and building of virtual environments. Manufacturers of transportation vehicles and their component equipment use manikins during crash safety tests, as well as passenger and driver comfort and usability. Industrial engineers and workplace designers may use computer-generated ergonomic manikins to simulate and design safe, productive, and attractive work environments.

Ergonomic manikins may be used by workplace designers to simulate, communicate and optimize manual handling tasks such as lifting, lowering, pushing, pulling and carrying. They may analyze designs faster with simplified workflows and reuse of saved analysis settings. Workplace designers may also leverage reporting capabilities to deliver products designed and optimized for humans and ensure conformance with health and safety guidelines and ergonomic standards.

Lifelike manikins may be designed to provide response information to various environmental conditions and events. Such manikins may be built with authentic anthropometry or human body dimensions.

Manual positioning of ergonomic manikins with functionality that is built into existing computer-aided design and computer-aided manufacturing tools may be iterative and time consuming. Alternatives may include using higher cost full body motion tracking and control to position a human model to develop awareness of safety and ergonomic issues. However, manually setting digital human postures inside tools including computer-aided systems may be costly and imprecise. In many circumstances, time constraints and costs of manually positioning a human model or contracting out these tasks to external providers of such services may not be practical. Thus, effective new techniques and tools may be desirable that integrate low cost sensing devices with computer-aided design and other tools.

SUMMARY

The illustrative embodiments provide for an apparatus for positioning structural models and controlling their design environments. The apparatus includes a processor and a memory in communication with the processor. The apparatus includes a motion-sensing input device, in communication with the processor, and configured to track a motion of an object and to generate sets of spatial coordinate data for at least one point located on the object. The apparatus includes an application stored in the memory, wherein when the application is executed by the processor the application is configured to receive a first set of spatial coordinate data for the at least one point from the motion-sensing input device. The application is also configured to send spatial coordinate data to a computer-aided design system, the computer-aided design system computing angle data to update a design of a model of the object based on the motion of the point located on the object. The illustrative embodiments also provide for a processor-implemented method for positioning an ergonomic manikin and controlling manikin design environments. The method includes a computer receiving a set of spatial coordinates from a motion-sensing input device, the spatial coordinates describing a position of at least one joint of a limb of a human model. The method includes the computer sending the set of spatial coordinates to a computer-aided design application, the computer-aided design application representing movements of the ergonomic manikin based on changes in limb angles described by a plurality of instances of angle data. The method includes the computer receiving angle specifications from a computer-aided design application, the angle specifications corresponding to an angle of the limb in at least one three-dimensional plane. The method includes the computer converting the set of spatial coordinates to angle data in accordance with the received angle specifications, the angle data describing positioning of the limb.

The illustrative embodiments also provide for a processor-implemented method of integrating a motion-sensing input device with a computer-aided design application to control an ergonomic manikin. The method includes a computer receiving three-dimensional x, y, and z coordinates representing positioning of skeletal joints during movements of a human model, the x, y, and z coordinates captured by the motion-sensing input device. The method includes the computer receiving information specifying degrees of freedom describing limb angles in at least one three dimensional plane. The method includes the computer determining at least one limb angle based on the degrees of freedom and the x, y, and z coordinates wherein the determined limb angle specifies an orientation of the ergonomic manikin. The method includes the computer providing the at least one limb angle to the computer-aided design application for use in representing movements of the limb.

The features, functions, and benefits may be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 1 is a block diagram of an apparatus for positioning structural models in accordance with an illustrative embodiment;

FIG. 2a is a flowchart depicting a method for positioning structural models in accordance with an illustrative embodiment;

FIG. 2b is a flowchart depicting a method for positioning structural models in accordance with an illustrative embodiment;

FIG. 3 is a block diagram of an apparatus for positioning structural models in accordance with an illustrative embodiment;

FIG. 4 is a flowchart depicting a process flow for positioning structural models in accordance with an illustrative embodiment;

FIG. 5 is a block diagram of an apparatus for positioning structural models in accordance with an illustrative embodiment;

FIG. 6 is a diagram depicting three dimensional planes for representing limb angles in accordance with an illustrative embodiment;

FIG. 7 is a diagram depicting coordinates for positioning of human limbs in accordance with an illustrative embodiment;

FIG. 14 is a diagram depicting coordinates for positioning of human limbs in accordance with an illustrative embodiment;

FIG. 15 is a diagram depicting coordinates for positioning of human limbs in accordance with an illustrative embodiment;

FIG. 16 is a diagram depicting coordinates for tracking hand position with respect to display cursor position in accordance with an illustrative embodiment;

FIG. 19 is a table defining angles as specified by a computer-aided design application for segments of a manikin on planes and axes receiving processing in accordance with an illustrative embodiment;

FIG. 20 is a table defining angles as specified by a computer-aided design application for segments of a manikin on planes and axes receiving processing in accordance with an illustrative embodiment;

FIG. 21 is a table defining angles as specified by a computer-aided design application for segments of a manikin on planes and axes receiving processing in accordance with an illustrative embodiment;

FIG. 32 presents graphs depicting normalization of vectors of associated limbs in accordance with an illustrative embodiment;

FIG. 33 is sample lookup table in accordance with an illustrative embodiment;

FIG. 34 presents graphs depicting vectors of limbs in accordance with an illustrative embodiment; and FIG. 35 is an illustration of a data processing system in accordance with an illustrative embodiment.

DETAILED DESCRIPTION

Figure 8:
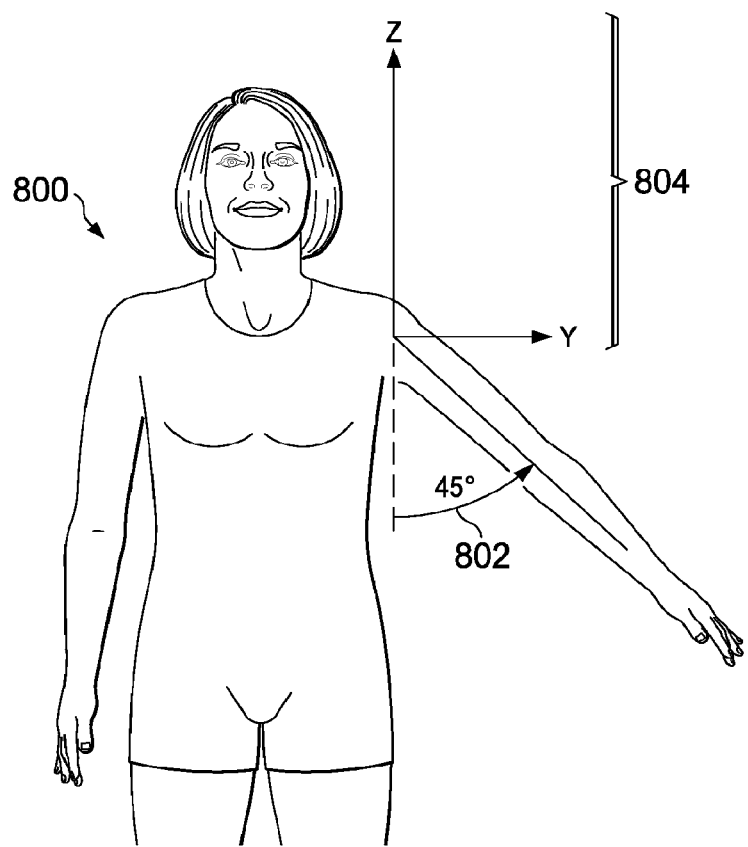
FIG. 8 is a diagram depicting coordinates for positioning of human limbs in accordance with an illustrative embodiment.

The illustrative embodiments recognize and take into account the issues described above with respect to providing economical tracking capability for posing ergonomic manikins. Such capability may enable a better situational awareness of design and manufacturing process decisions when applicable throughout a product lifecycle. The illustrative embodiments may allow a user to perform work as adequate gesture and voice control is provided to enable control of a computer-aided design environment without using mouse, keyboard, or other manual input devices.

The illustrative embodiments also provide for marker-less motion tracking and capture capabilities that may use low cost motion-sensing input equipment in conjunction with computer-aided design systems. These tracking and capture capabilities may enable relatively low cost full body tracking and control of ergonomic manikins as well as other three-dimensional geometry and application functions.

External input devices such as motion-sensing equipment devices may be used to control ergonomic human model postures and positions. These devices may be integrated with computer-aided design systems to perform basic view functions previously performed by a mouse and keyboard. Integration may be performed to track skeletal motion and output x, y, and z coordinates for a plurality of skeletal joint. Integration may also be performed to recognize voice commands by using a microphone array included with motion-sensing devices.

The illustrative embodiments also provide for integration of content captured by motion-sensing devices with computer-aided design systems. Integration may use application programming interfaces associated with the computer-aided design systems to allow input of data collected from motion-sensing devices to be transformed by algorithms provided herein. The algorithms enable transformation of the collected data into formats that may be required by the computer-aided design systems to control an ergonomic human model or the computer-aided design environment.

A motion-sensing input device may track motion of a human model and generate sets of spatial coordinate data for points located on the manikin. A point on the object may be represented by the three dimensional x, y, and z Cartesian coordinates. In other illustrative embodiments other coordinate schemes may be used, such as but not limited to spherical coordinates. Algorithms provided herein may convert the spatial coordinate data to angle data. The angle data may be used in specifying an orientation and a position of the ergonomic manikin. The computer-aided design system computes and uses the angle data to position and orient the ergonomic manikin. Spatial coordinate data for a plurality of joints on limbs of the manikin may be gathered during movements of the limbs.

The illustrative embodiments provide a plurality of algorithms that integrate motion-sensing input device with computer-aided design system. Integration enables computer-aided design systems to position ergonomic manikins in poses similar to those taken by human models and captured by motion-sensing input devices. The illustrative embodiments enable use of voice control to rotate human models relative to environments created by computer-aided design systems. A combination of voice commands and body motions is also enabled to perform various camera functions in workbench environments of computer-aided design systems.

The illustrative embodiments may be of use in applications wherein ergonomic and safety analysis is performed as part of product development and support. Manufacturers of automobiles and other motor vehicles, heavy equipment, and aircraft may find use for the systems and methods provided herein. Illustrative embodiments may enable design and manufacturing engineers to evaluate various scenarios. Engineers may execute these tasks while working with their configuration-controlled product and process data management systems. Cost reduction may be achieved by providing engineers improved situational awareness of how a product is assembled and used. Design changes may be reduced when a product reaches manufacturing stages.

Attention is now turned to the figures. FIG. 1 is an illustration of a block diagram of system 100 for positioning structural models in accordance with an illustrative embodiment. System 100 includes data transmission server 110, computer-aided design system 130, conversion application 132, sensing device 140, and manikin 150.

System 100 shown in FIG. 1 may be implemented using one or more data processing systems, possibly in a distributed or networked environment, and possibly by a group of remotely administered data processing systems known as a "cloud." Each of the one or more data processing systems that implement system 100 may be data processing system 3500 described in respect to FIG. 35, or variations thereof. System 100 may be characterized as including one or more blocks. Each of these blocks may be separate or may be part of a monolithic architecture.

Data transmission server 110 may be a computer system. Server component 122 executes on data transmission server 110. Conversion application 132 executes on computer-aided design system 130 and includes a plurality of algorithms. Conversion application 132 integrates content captured by sensing device 140 with functionality of computer-aided design system 130. Although the illustrative embodiments refer to sensing device 140, the illustrative embodiments contemplate use of multiple sensing devices. Thus, the term "sensing device" may be taken as being either in the singular sense or the plural sense.

Conversion application 132 may position manikin 150 in a same or similar pose taken by a human model being tracked by sensing device 140 in real time or from recorded data. Conversion application 132 may record data of desired pose information for use and reuse in analysis. Conversion application 132 may execute a combination of voice commands and arm motions provided by a user to perform functions such as pan, zoom, and rotate in workbench environments provided by computer-aided design system 130. Such voice commands may be used to change a view of a user from a pre-set second person perspective viewing manikin 150 to an over-the-shoulder, first person perspective of a human model. Voice control may be used to adjust distance of first person perspective behind the model.

Conversion application 132 may also provide for use of voice control to rotate a human model relative to an environment of computer-aided design system 130. Such rotation may be performed to compensate for a single camera view provided by sensing device 140 and to compensate for a requirement to view a person aligned to camera. Voice control provided by conversion application 132 may enable toggling between skeletal tracking and control of manikin 150 and a screen overlay menu for gesture control of an environment provided by computer-aided design system 130. Conversion application 132 may also provide for visual on-screen prompts to support correct interpretations of voice commands made by a user.

Conversion application 132 may also provide voice control allowing toggling between enablement of a screen overlay menu used to identify gesture control of computer-aided design system 130 and the removal of screen overlay and gesture control to allow for user discussion during an ongoing session. Conversion application 132 may also provide for use of specific voice commands to toggle between turning off other voice commands acted upon to allow for conversion during an ongoing session and thereafter re-engaging voice control functionality using a key word.

Conversion application 132 includes a plurality of components. Components include client component 134, command component 136, and dialogue component 138. Server component 122, which executes on data transmission server 110, receives input from sensing device 140 and transmits the input in a data stream to client component 134. Server component 122 may resolve incompatibilities between requirements of sensing device 140 and requirements of computer-aided design system 130. For example, sensing device 140 may use a 32-bit format and require one version of an integrated software development environment. Computer-aided design system 130 may, by contrast, use a 64-bit format and require a different integrated software development environment. Server component 122 may resolve these incompatibilities.

Server component 122 may display camera video images captured by sensing device 140 for visualization. Server component 122 may also provide controls for managing various audio aspects. In an embodiment, elements of server component 122 as well as elements of conversion application 132, client component 134, command component 136, and dialogue component 138 may execute on more than one physical computer. For example, a first portion of server component 122 may execute on data transmission server 110 and a second portion of server component 122 may execute on a computer hosting computer-aided design system 130. In another embodiment, portions of conversion application 132 may execute on data transmission server 110. Client component 134 receives data stream from server component 122. Client component 134 may allow processing of data as needed independent of any software development kit or other software tools associated with sensing device 140.

Command component 136 extends capabilities of computer-aided design system 130. Command component 136 provides customized commands that integrate with application programming interfaces of computer-aided design system 130. Command component 136 integrates client component 134 to process camera data and other input data.

Command component 136 may provide two states of operation and means to transition between the two states. Command component 136 presents a dialog that may enable a user to set various modes operational states.

A first operational state provided by command component 136 is manikin control. Manikin control may use selection point data received from sensing device 140 to compute various angles needed to specify limb orientation and position set by computer-aided design system 130. As noted, client component 134 receives data stream content generated by sensing device 140. Data stream content is received from server component 122 in real time or near real time such that manikin 150 may appear to be animated. A secondary capability of manikin control is controlling three dimensional viewpoint of computer-aided design system 130. Such control may allow viewing of manikin 150 from an existing viewpoint or changing to a sight point to a first or second viewpoint.

A second operational state provided by command component 136 is scene control using gesturing. Scene control and gesturing presents an overlay window over a session of computer-aided design system 130. The overlay window may contain various icons that enable control of the three dimensional viewpoint of a scene provided by computer-aided design system 130. Skeleton point data for a body part in motion, for example, may be tracked, and a cursor in the overlay window may be moved a corresponding distance and direction. If the cursor is positioned and hovers over an icon for several seconds, for example, then the icon's corresponding command function may be executed for as long as the cursor remains positioned over the icon.

Commands affect the three dimensional viewpoint in a scene provided by computer-aided design system 130. Commands implemented allow panning in the right, left, up, and down directions. Commands implemented also allow for rotation about a viewpoint target point and scaling in and out from a target point. Dialogue component 138 is associated with command component 136 and presents a graphical user interface allowing a user to control and manipulate functionality of data transmission server 110 and computer-aided design system 130.

Sensing device 140 may be a camera and audio array that captures motion and sound, but may be fewer sensing devices or perhaps one or more additional or different sensing devices. Sensing device 140 allows users to control and interact without the need to physically touch devices through a natural user interface using gestures and spoken commands. Sensing device 140 may include a depth camera and a microphone enabling gesture recognition, facial recognition, and voice recognition. Sensing device 140 may connect with data transmission server 110 or other devices using a universal serial bus connection. Elements of sensing device 140 may wirelessly connect to data transmission server 110, to each other, or to other components. While in an illustrative embodiment sensing device 140 may use infrared technology for sensing, other technologies such as acoustic technologies and visible light technologies may be used.

Manikin 150 may include limb 152, limb 154, limb 156, and limb 158. In an embodiment, movements of joints and other components associated with limb 152, limb 154, limb 156, and limb 158 may be tracked and captured by sensing device 140 and processed by conversion application 132 and computer-aided design system 130 as described herein.

Components of system 100 may provide for positioning of structural models and for controlling design environments of structural models. An application, that may be server component 122, receives a first set of spatial coordinate data from sensing device 140 for at least one point located on an object. Application sends spatial coordinated data to computer-aided design system 130 that computes angle data to update a design of a model of the object based on motion of the point. Application uses a plurality of observations of spatial coordinates generated successively during a period of time. Application generates skeleton point data from the first set of spatial coordinate data and computes a limb angle to specify an orientation of ergonomic manikin from the skeleton point data. Ergonomic manikin may be manikin 150 provided by system 100. Limb angle may be described by angle specifications in one of three primary planes in a three-dimensional space.

The illustrative embodiments shown in FIG. 1 are not meant to imply physical or architectural limitations to the manner in which different illustrative embodiments may be implemented. Other components in addition to and/or in place of the ones illustrated may be used. Some components may be unnecessary in some illustrative embodiments. Also, the blocks are presented to illustrate some functional components. One or more of these blocks may be combined and/or divided into different blocks when implemented in different illustrative embodiments. FIG. 2a is a flowchart depicting a method for positioning structural models in accordance with an illustrative embodiment. Method 200 shown in FIG. 2 may be implemented using system 100 of FIG. 1. The process shown in FIG. 2 may be implemented by a processor, such as processor unit 3504 of FIG. 35. The process shown in FIG. 2 may be a variation of the processes shown in FIG. 1 and FIG. 3 through FIG. 34. Although the operations presented in FIG. 2 are described as being performed by a "process," the operations are being performed by at least one tangible processor or using one or more physical devices, as described elsewhere herein. The term "process" also includes computer instructions stored on a non-transitory computer readable storage medium.

Method 200 provides for positioning an ergonomic manikin and controlling manikin design environments. Ergonomic manikin may be manikin 150 provided by system 100. Method 200 may begin as the process receives a set of spatial coordinates from a motion-sensing input device, the spatial coordinates describing a position of at least one joint of a limb of a human model (operation 202). The computer sending the set of spatial coordinates to a computer-aided design application, the computer-aided design application representing movements of the ergonomic manikin based on changes in limb angles described by a plurality of instances of angle data (operation 204). The process may then receive angle specifications from a computer-aided design application, the angle specifications corresponding to an angle of the limb in at least one three-dimensional plane (operation 206). The process may then convert the set of spatial coordinates to angle data in accordance with the received angle specifications, the angle data describing positioning of the limb (operation 208). The process may terminate thereafter. The process shown in FIG. 2a may be varied. For example, in an illustrative embodiment, the motion-sensing input device may be a depth camera. In an illustrative embodiment, the depth camera may be controlled at least by gestures and voice commands. In an illustrative embodiment, the computer may execute a plurality of algorithms integrating the motion-sensing input device with the computer-aided design application wherein the algorithms enable full body tracking and manikin control.

In an illustrative embodiment, the algorithms may transform coordinates collected by the motion-sensing input device into coordinate formats used by the computer-aided design application to control at least one of the ergonomic manikin and a development environment. In an illustrative embodiment the algorithms may resolve incompatibilities between data formats used by the motion-sensing input device and the computer-aided design application.

FIG. 2b is a flowchart depicting a method for positioning structural models in accordance with an illustrative embodiment. Method 210 shown in FIG. 2b may be implemented using system 100 of FIG. 1. Method 210 also may be implemented by a processor, such as processor unit 3504 of FIG. 35. Method 210 may be a variation of the processes shown in FIG. 1 and FIG. 3 through FIG. 34. Although the operations presented in FIG. 2b are described as being performed by a "process," the operations are being performed by at least one tangible processor or using one or more physical devices, as described elsewhere herein. The term "process" also includes computer instructions stored on a non-transitory computer readable storage medium.

Method 210 may begin as the process receives three-dimensional x, y, and z coordinates representing positioning of skeletal joints during movements of a human model, the x, y, and z coordinates captured by the motion-sensing input device (operation 212). The process may then receive information specifying degrees of freedom describing limb angles in at least one three dimensional plane (operation 214). The process may then determine at least one limb angle based on the degrees of freedom and the x, y, and z coordinates wherein the determined limb angle specifies an orientation of the ergonomic manikin (operation 216). The process may then provide the at least one limb angle to the computer-aided design application for use in representing movements of the limb (operation 218).

The computer, that may be data transmission server 110 provided by system 100, executes a plurality of algorithms that integrate the motion-sensing input device with the computer-aided design application to at least enable positioning of the ergonomic manikin by the computer-aided design application in a same pose taken by the human model and captured by the motion-sensing input device. Motion-sensing input device may be sensing device 140 provided by system 100. Ergonomic manikin may be manikin 150 provided by system 100. Integration of the motion-sensing input device with the computer-aided design application by the plurality of algorithms further enables voice control to toggle between skeletal tracking and ergonomic manikin control and a screen overlay menu of an environment of the computer-aided design application.

FIG. 3 is a block diagram of an apparatus for positioning structural models in accordance with an illustrative embodiment. The components of FIG. 3 are provided in system 300 and may map or correspond to those depicted in and described herein in association with FIG. 1 and system 100. Computer 310 may correspond to data transmission server 110 depicted in FIG. 1. Server component 322 may correspond to server component 122 depicted in FIG. 1. Computer-aided design system 330 may correspond to computer-aided design system 130 depicted in FIG. 1. Sensing device 340 may correspond to sensing device 140 depicted in FIG. 1. While computer-aided design system 130 is depicted in FIG. 1 as a component separate from data transmission server 110, in an embodiment portions or entirety of computer-aided design system 130 may execute on data transmission server 110.

FIG. 4 is a flowchart depicting a method for positioning structural models in accordance with an illustrative embodiment. Actions and events depicted in FIG. 4 for a method 400 may correspond to actions and events associated with components described in FIG. 1 and FIG. 3 in association with system 100 and system 300, respectively, as well as operations described in association with method 200 depicted in FIG. 2.

Although the operations presented in FIG. 4 are described as being performed by a "process," the operations are being performed by at least one tangible processor or using one or more physical devices, as described elsewhere herein. The term "process" also includes computer instructions stored on a non-transitory computer readable storage medium.

Method 400 may begin as the process reads data, either text data or skeleton data (operation 402). The process then determines whether the data contains text (operation 404). In response to the data containing text (a "yes" response to operation 404), the process makes another determination whether the text is a "gesture" (operation 406). Alternatively, if the data does not contain text (a "no" response to operation 404), then the process makes still another determination whether the data is in a "gesture mode" (operation 408).

Returning to operation 404, if the text is a "gesture", then the process makes another determination if the text is a gesture (operation 406). If not, other voice commands are processed (operation 416). The process may terminate thereafter.

If yes at operation 406, then gesture mode is toggled (operation 410) and the process then determines if gesture mode is on (operation 422). If yes, overlay icons are activated (operation 426). If no, overlay icons on desktop are deactivated (operation 428).

Returning to operation 408, the process makes another determination whether the data is in a "gesture mode." If yes, the process updates screen cursor based on right hand position (operation 412). The process then determines if cursor is over icon (operation 418). If no, the process returns to operation 412. If yes, the process executes functionality associated with icon (operation 430). The process may terminate thereafter.

Returning to operation 408, if no, the process computes degree of freedom angles for each skeleton segment (operation 414). The process then determines if the subject segment is a left or right arm (operation 420). If no, the process updates manikin segment degree of freedoms (operation 432) and redraws scene, a scene provided by computer-aided design system 130 (operation 434). The process may terminate thereafter.

If yes at operation 420, the process looks up arm angles from pre-computed arm vector tables (operation 424). The process then updates manikin segment degree of freedoms (operation 432), and redraws scene, the scene provided by computer-aided design system 130 (operation 434). The process may terminate thereafter.

FIG. 5 is a block diagram of an apparatus for positioning structural models in accordance with an illustrative embodiment. The components of FIG. 5 are provided in a system 500 and may map or correspond to those depicted in and described herein in association with FIG. 1 and system 100. The components of FIG. 5 may also correspond to those provided in FIG. 3 and system 300. System 500 shown in FIG. 5 is a specific and non-limiting example of these systems described above.

For example, server component 522 may correspond to server component 122 of system 100. Client component 534 may correspond to client component 134 of system 100. Command component 536 may correspond to command component 136 of system 100. Dialogue component 538 may correspond to dialogue component 138 of system 100. In an embodiment represented in FIG. 5, client component 534 and dialogue component 538 are subcomponents of command component 536. Computer-aided design system 530 may correspond to computer-aided design system 130 of system 100. Sensing device 540 may correspond to sensing device 140 of system 100. Operating system 560 and microphone 570 are, respectively, a computer operating system that may execute on data transmission server 110 and a device for receiving spoken and other sounds. In an embodiment, operating system 560 is WINDOWS® available from Microsoft Corporation. WINDOWS® is a registered trademark of Microsoft Corporation.

The illustrative embodiments shown in FIG. 5 are not meant to imply physical or architectural limitations to the manner in which different illustrative embodiments may be implemented. Other components in addition to and/or in place of the ones illustrated may be used. Some components may be unnecessary in some illustrative embodiments. Also, the blocks are presented to illustrate some functional components. One or more of these blocks may be combined and/or divided into different blocks when implemented in different illustrative embodiments.

FIG. 6 is a diagram depicting three dimensional planes for representing limb angles in accordance with an illustrative embodiment. Also in view of FIG. 1, and using its reference numerals, the illustrative embodiments provide algorithms that convert skeleton point data generated by sensing device 140 to angle data required by computer-aided design system 130 and its associated application programming interfaces. For each of limb 152, limb 154, limb 156, and limb 158 of manikin 150, computer-aided design system 130 defines two or three angle specifications called degrees of freedom. A degree of freedom corresponds to a limb angle in one of three primary planes in a Cartesian coordinate system, such as Cartesian coordinate system 600, which includes X axis 602, Y axis 604, and Z axis 606. The three primary planes may be plane XY 608, plane YZ 610, or plane ZX 612. However, other planes may be used as the primary planes. The illustrative embodiments provide algorithms that compute one or more of these limb angles to specify orientation of manikin 150 from skeleton point data.

FIG. 7 and FIG. 8 may be used to provide further illustration of FIG. 6. FIG. 7 is a diagram depicting ZX coordinates 700 for positioning of human limbs in accordance with an illustrative embodiment. FIG. 8 is a diagram depicting ZY coordinates 800 for positioning of human limbs in accordance with an illustrative embodiment. A 30 degree angle specification 702 for a flexion/extension degree of freedom in the ZX plane 704 as is shown in FIG. 7. A 45 degree angle specification 802 for an abduction/adduction degree of freedom in the YZ plane 804 as is shown in FIG. 8.

Figure 9:
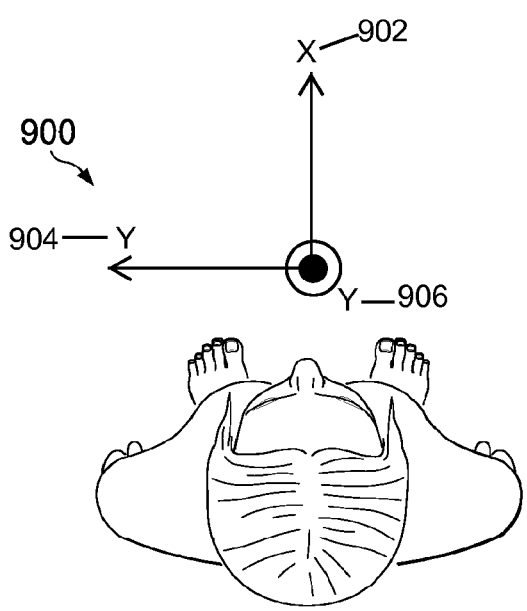
FIG. 9 is a diagram depicting coordinates for a motion-sensing device relative to a human model in accordance with an illustrative embodiment.

FIG. 9 is a diagram depicting coordinates for a motion-sensing device relative to a human model in accordance with an illustrative embodiment. FIG. 9 depicts a coordinate system 900 of sensing device 140 with reference to the human body. In coordinate system 900, X axis 902, Y axis 904, and Z axis 906 are depicted.

Figure 10:
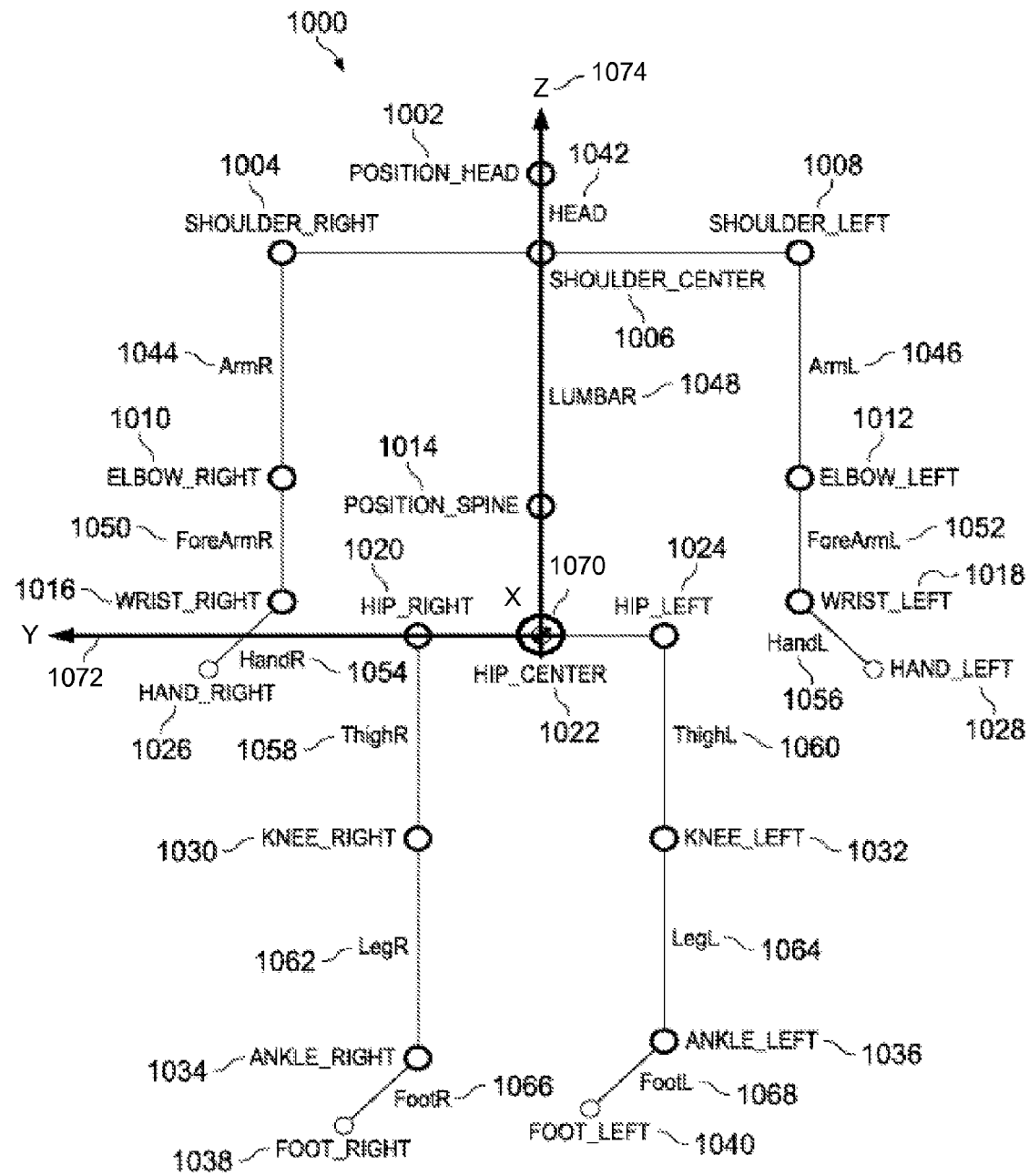
FIG. 10 is a diagram depicting coordinate system and points received from a motion-sensing device in accordance with an illustrative embodiment.
Figure 11:
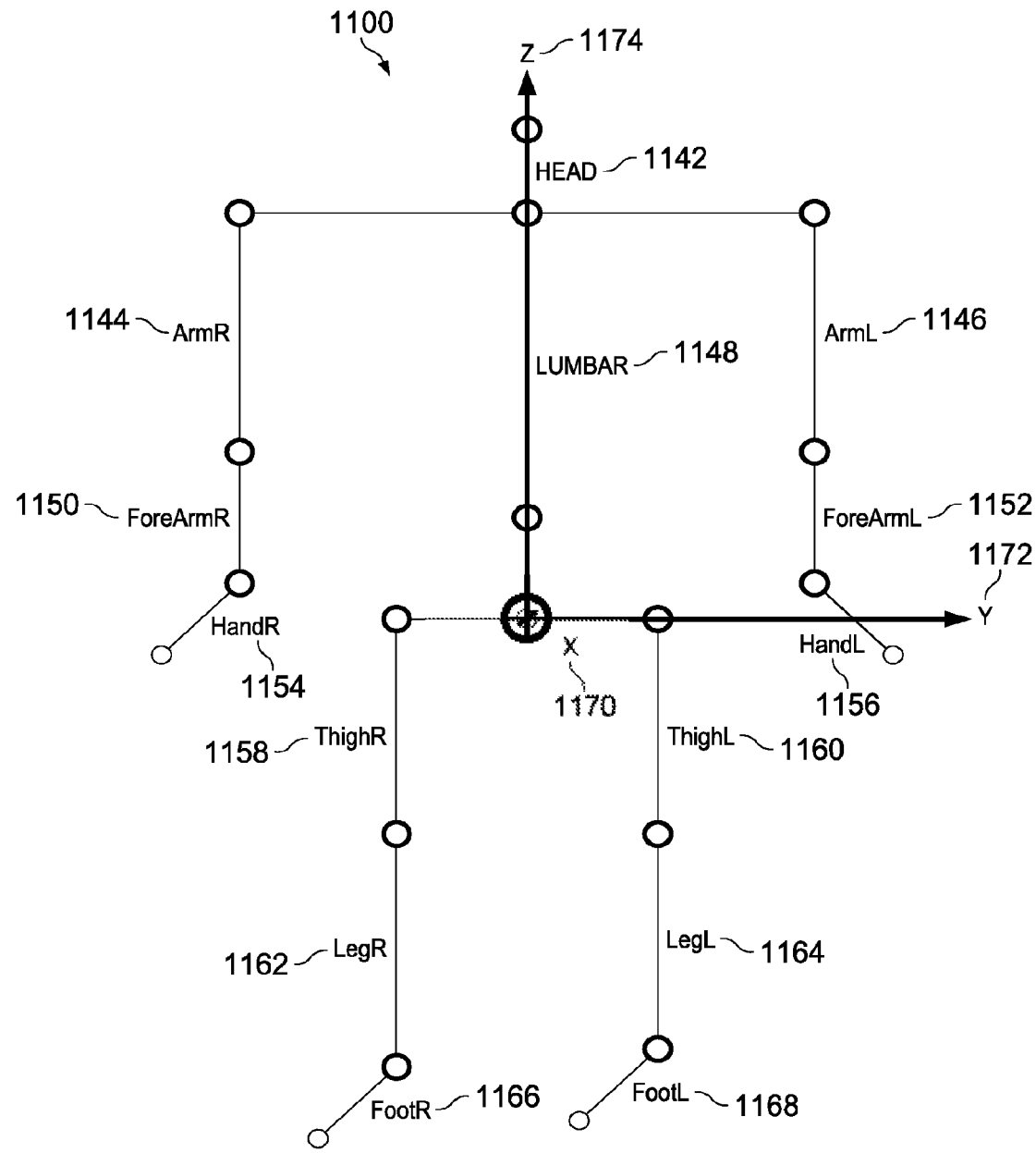
FIG. 11 is a diagram depicting coordinate system and segments an ergonomic manikin in accordance with an illustrative embodiment.

FIG. 10 is a diagram depicting coordinate system and points received from a motion-sensing device in accordance with an illustrative embodiment. FIG. 11 is a diagram depicting coordinate system and segments for an ergonomic manikin in accordance with an illustrative embodiment. The skeleton as viewed and processed by sensing device 140 is composed of twenty points which are labeled in system 1000 depicted in FIG. 10: POSITION_HEAD 1002, SHOULDER_RIGHT 1004, SHOUDER_CENTER 1006, SHOULDER_LEFT 1008, ELBOW_RIGHT 1010, ELBOW_LEFT 1012, POSITION_SPINE 1014, WRIST_RIGHT 1016, WRIST_LEFT 1018, HIP_RIGHT 1020, HIP_CENTER 1022, HIP_LEFT 1024, HAND_RIGHT 1026, HAND_LEFT 1028, KNEE_RIGHT 1030, KNEE_LEFT 1032, ANKLE_RIGHT 1034, ANKLE_LEFT 1036, FOOT_RIGHT 1038, and FOOT_LEFT 1040. HIP_CENTER point 1022 indicates the origin of the skeleton position in space. Computer-aided design system 130 specifies an orientation of manikin 150 based on the angles of the segments (or limb 152, limb 154, limb 156, and limb 158 or bones) between the skeleton points. There are fourteen segments that are labeled Head 1042, ArmR 1044, ArmL 1046, Lumbar 1048, ForeArmR 1050, ForeArmL 1052, HandR 1054, HandL 1056, ThighR 1058, ThighL 1060, LegR 1062, LegL 1064, FootR 1066, and FootL 1068. The coordinate system, points, and segments of sensing device 140 are illustrated in FIG. 10. FIG. 10 also depicts X axis 1070, Y axis 1072, and Z axis 1074.

FIG. 11 similarly depicts elements of the human body. Components depicted in FIG. 11 are indexed to components depicted in FIG. 10. There are fourteen segments comprising a system 1100 that are labeled Head 1142, ArmR 1144, ArmL 1146, Lumbar 1148, ForeArmR 1150, ForeArmL 1152, HandR 1154, HandL 1156, ThighR 1158, ThighL 1160, LegR 1162, LegL 1164, FootR 1166, and FootL 1168. The coordinate system, points, and segments of sensing device 140 are illustrated in FIG. 11. FIG. 11 also depicts X axis 1170, Y axis 1172, and Z axis 1174.

Figure 12:
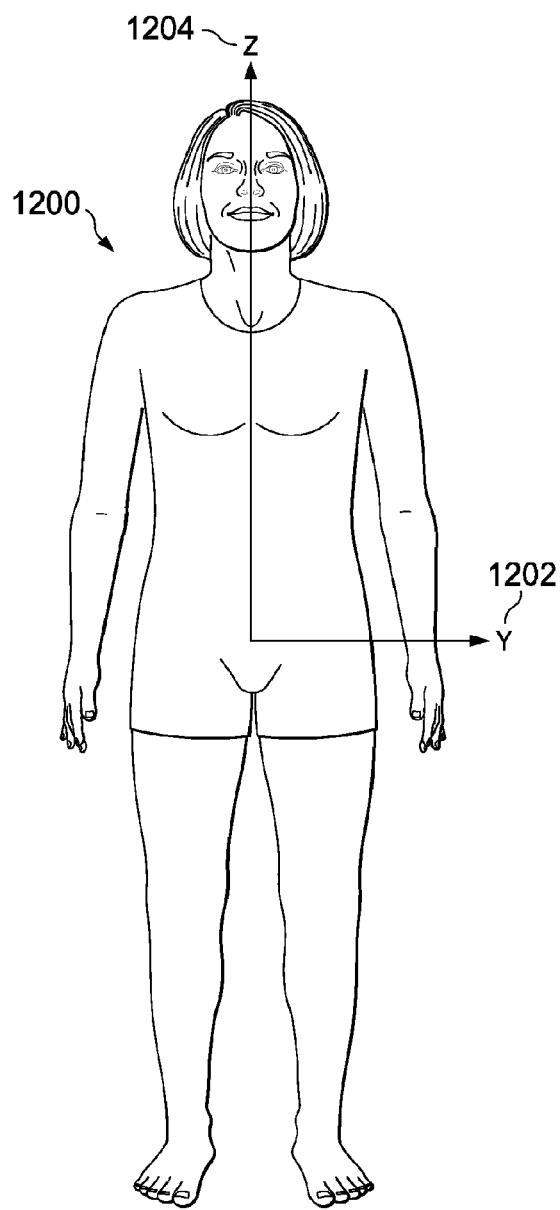
FIG. 12 is a diagram depicting coordinates for positioning of human limbs in accordance with an illustrative embodiment.
Figure 13:
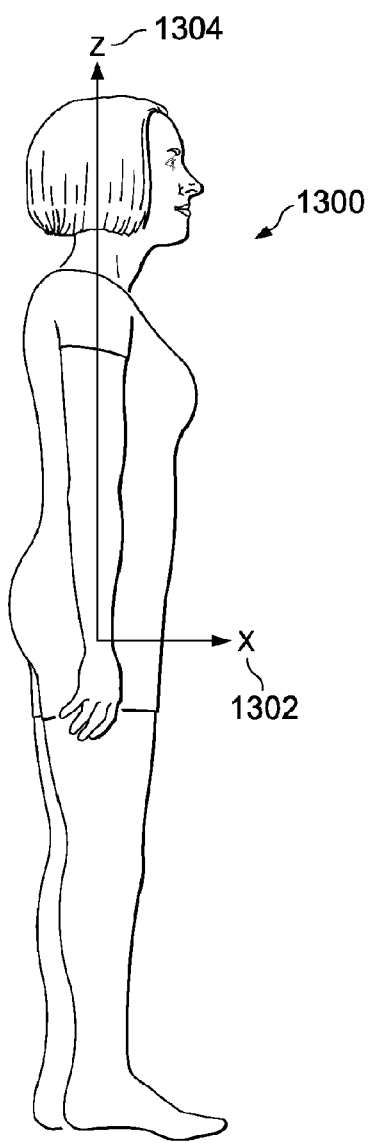
FIG. 13 is a diagram depicting coordinates for positioning of human limbs in accordance with an illustrative embodiment.

FIG. 12, FIG. 13, FIG. 14, and FIG. 15 are diagrams depicting coordinates for positioning of human limbs in accordance with an illustrative embodiment. The manikins shown in these figures may be manikin 150 of FIG. 1. Manikin 1200 depicted in FIG. 12, manikin 1300 depicted in FIG. 13, manikin 1400 depicted in FIG. 14, and manikin 1500 depicted in FIG. 15 may be defined by a right-hand coordinate system when facing the manikin 150 as shown in FIG. 12, FIG. 13, FIG. 14, and FIG. 15. A default orientation of manikin 150 may be an upright vertical state with arms and legs straight down. The geometry of manikin 150 may be measured in millimeters, though other units of length may be used. FIG. 12 also depicts Y axis 1202 and Z axis 1204. FIG. 13 also depicts X axis 1302 and Z axis 1304. FIG. 14 also depicts X axis 1402 and Z axis 1404. FIG. 15 also depicts X axis 1502 and Y axis 1504.

Algorithms provided herein define a coordinate transformation that transforms a coordinate system of sensing device 140 to a coordinate system of computer-aided design system 130. Coordinates may be converted from one unit of measure to another, such as meters to millimeters, in order to provide a standard length for computer-aided design system 130. An example transformation is given below:

$$\begin{bmatrix} 0 & 0 & -1 \\ -1 & 0 & 0 \\ 0 & 1 & 0 \end{bmatrix} \cdot \begin{bmatrix} x \\ y \\ z \end{bmatrix}$$

FIG. 16 is a diagram 1600 depicting coordinates for tracking hand position with respect to display screen cursor position in accordance with an illustrative embodiment. FIG. 16 depicts screen coordinates computation for gesture mode tracking of the right hand. In gesture mode, the right hand position of the skeleton is used to control cursor location on a computer display. The right hand skeleton point has previously been transformed to the coordinate space of computer-aided design system 130. The cursor location is represented by two-dimensional coordinates in pixel units.

While tracking in gesture mode, algorithms maintain a variable (P) having the last right hand position processed. When a new hand position (C) is acquired the delta or change in position (D) from the previous position is computed:

$$D=C-P$$

$$P=C$$

The delta vector (D) 1602 is orthogonally projected onto the YZ plane 1604 (i.e. ignore the X coordinate). The two-dimensional delta vector is then converted from meter to pixel units. This conversion may be performed by first converting from meters to inches and then multiplying by number of display pixels in one inch. A screen cursor location is then updated by subtracting the delta vector from its current location value. Subtraction is required since the screen coordinate axes are in opposite directions of the YZ plane axes.

Figure 17:
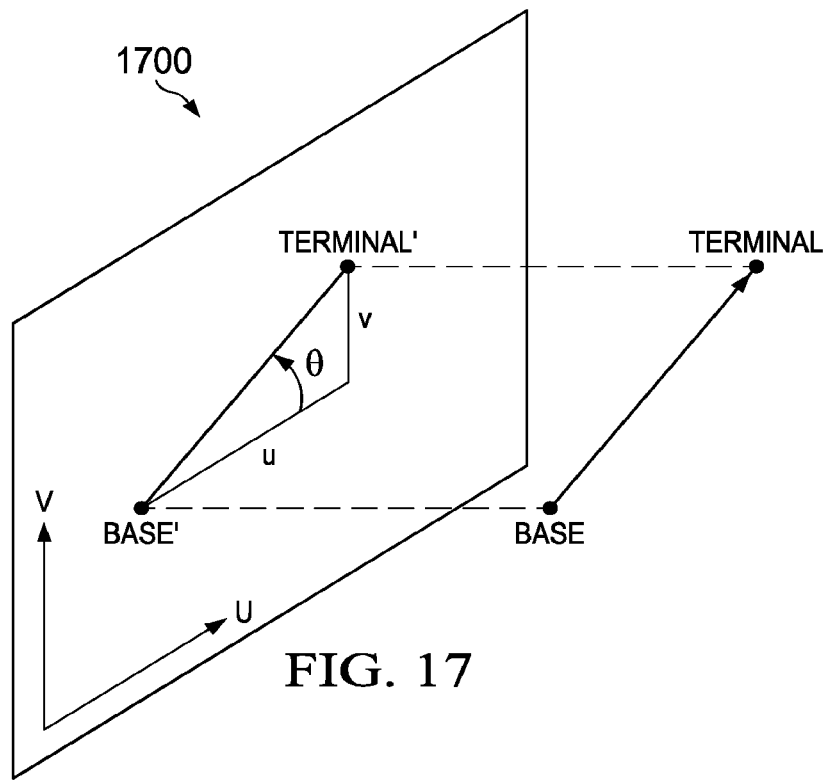
FIG. 17 is a diagram of vectors representing limb angles in accordance with an illustrative embodiment.

FIG. 17 is a diagram 1700 of vectors representing limb angles in accordance with an illustrative embodiment. FIG. 17 depicts how limb angles are computed by projecting a segment onto one or more primary planes. A limb segment is defined by two points: the base and the terminal point. The direction of the limb 152 is a vector defined by terminal-base points as illustrated in FIG. 17. The projection is orthographic, that is normal to the plane.

Figure 18:
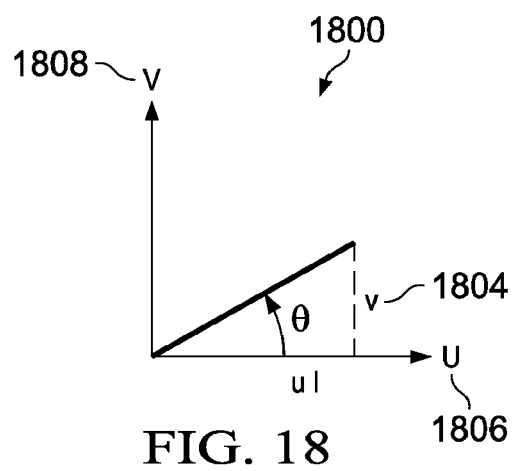
FIG. 18 is a graph providing analysis of vectors representing limb angles in accordance with an illustrative embodiment.

FIG. 18 is a graph providing analysis of vectors representing limb angles in accordance with an illustrative embodiment. FIG. 18 depicts a projected vector. The projected vector of the line segment is (terminal'—base') having components u 1802 and v 1804 that are parallel to the U 1806 and V 1808 axes respectively. The inclination angle of the projected line is computed using the standard library function a tan 2(v,u) which takes as arguments the opposite and adjacent sides of the triangle.

Regarding normalization, forearm and leg segment angles, for example, are dependent on arm and thigh segment orientations, respectively. An approach taken by algorithms taught herein is to normalize arm and thigh segments so the segments align in the Z direction. Corresponding angles of forearm and leg are computed from the transformed positions. The lumbar may be vertical or upright. Normalizing upper body segments may not be required for current usage but algorithms provided herein may incorporate such transformations.

Figures 22, 23:
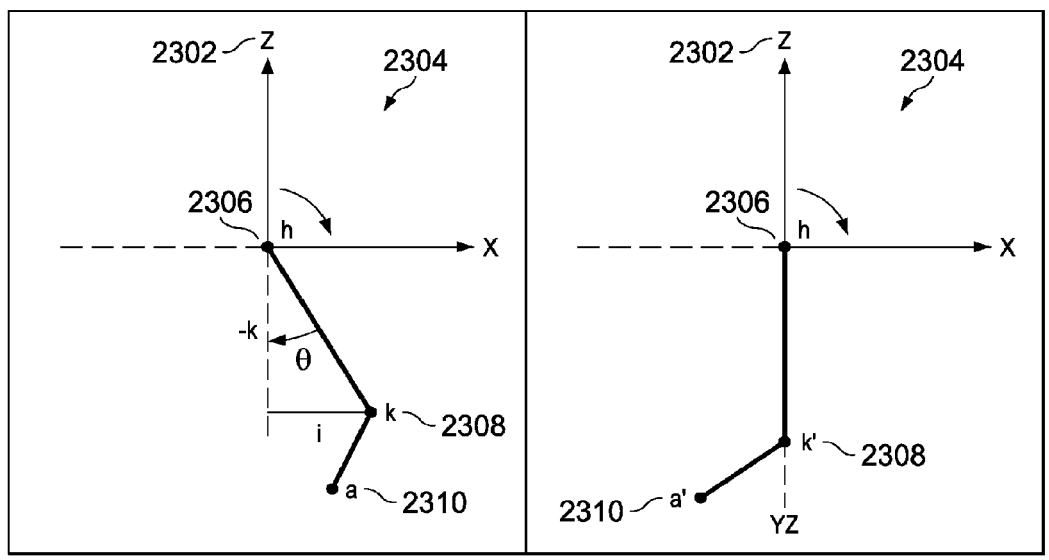
FIG. 22 is a table defining angles as specified by a computer-aided design application for segments of a manikin on planes and axes receiving processing in accordance with an illustrative embodiment.
FIG. 23 presents graphs depicting normalization of vectors of associated limbs in accordance with an illustrative embodiment.

FIG. 19, FIG. 20, FIG. 21, and FIG. 22 are tables defining angles as specified by a computer-aided design application for segments of a manikin on planes and axes receiving processing in accordance with an illustrative embodiment. Tables depicted in FIG. 19, FIG. 20, FIG. 21, and FIG. 22 define positive angles as specified by computer-aided design system 130 for segments of manikin 150 on each of applicable planes and axes being processed. Start point of a projected segment is depicted at the origin. For discussion purposes, it is assumed that all dependent segments have been transformed to their normalized positions. Vector components i 1902, j 1904, and k 1906 in FIG. 19 represent the projected segment vector onto the indicated planes. Vector components i 1902, j 1904, and k 1906 are sign values passed to the a tan 2 function as described previously. Vector components in FIG. 20, FIG. 21, and FIG. 22 are indexed to corresponding components depicted in FIG. 19.

FIG. 23 presents graphs depicting normalization of vectors of associated limbs in accordance with an illustrative embodiment. Forearm and leg segment angles are dependent on the arm and thigh segment orientations respectively. Algorithms provided herein normalize the arm and thigh segments so the segments align in a Z direction. Corresponding angles of the forearm and leg are computed from the transformed positions. Lumbar is vertical or upright. Normalizing the upper body segments may not be required for current usage but algorithms provided herein may incorporate this transformation where necessary. FIG. 23 depicts vectors of the right thigh and leg where the thigh is aligned with the Z axis 2302 in the XZ plane 2304. (h) is hip point 2306, (k) is knee point 2308, and (a) is ankle point 2310. Prime points show transformed positions.

Figure 24:
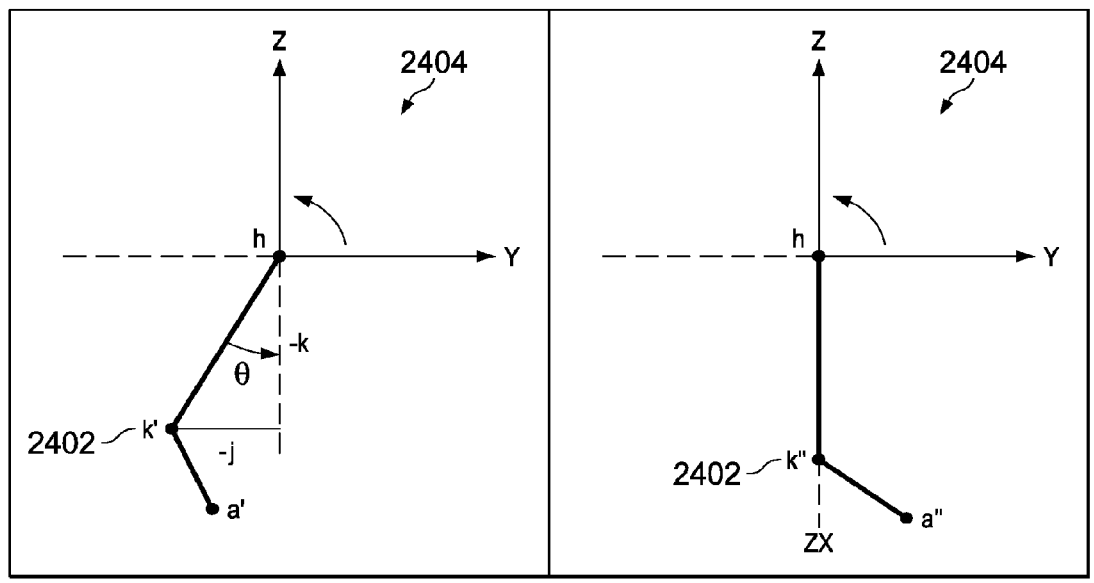
FIG. 24 presents graphs depicting normalization of vectors of associated limbs in accordance with an illustrative embodiment.

FIG. 24 presents graphs depicting normalization of vectors of associated limbs in accordance with an illustrative embodiment. A transformed thigh vector from the hip to the transformed knee (k') points 2402 is rotated in the YZ plane 2404 about the X axis to align with the ZX plane.

Figure 25:
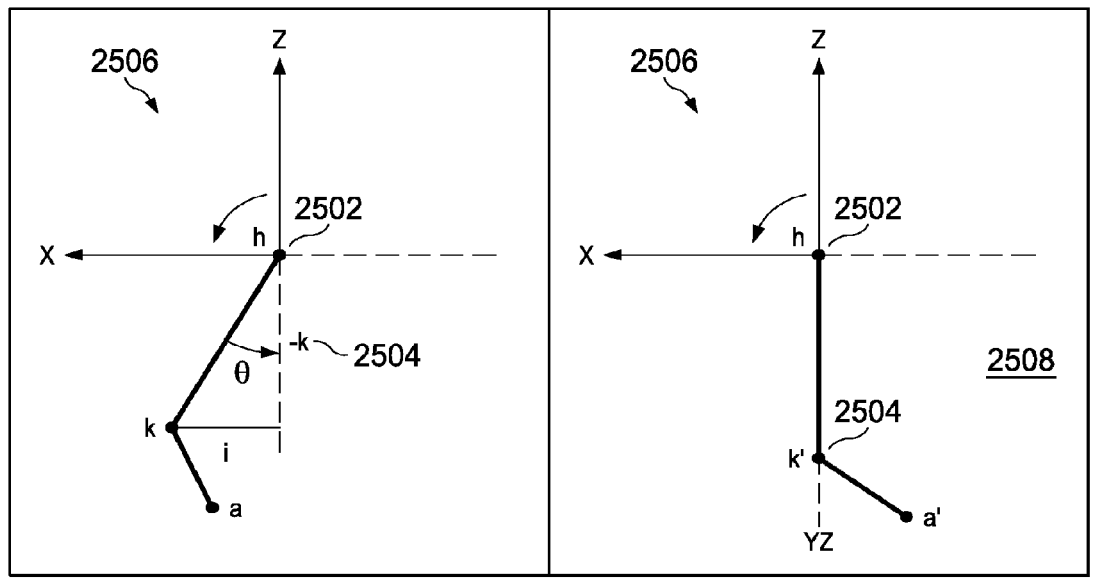
FIG. 25 presents graphs depicting normalization of vectors of associated limbs in accordance with an illustrative embodiment.

FIG. 25 presents graphs depicting normalization of vectors of associated limbs in accordance with an illustrative embodiment. The vector from the hip (h) 2502 to the knee (k) 2504 points is rotated in the ZX plane 2506 about the Y axis onto the YZ plane 2508.

Figure 26:
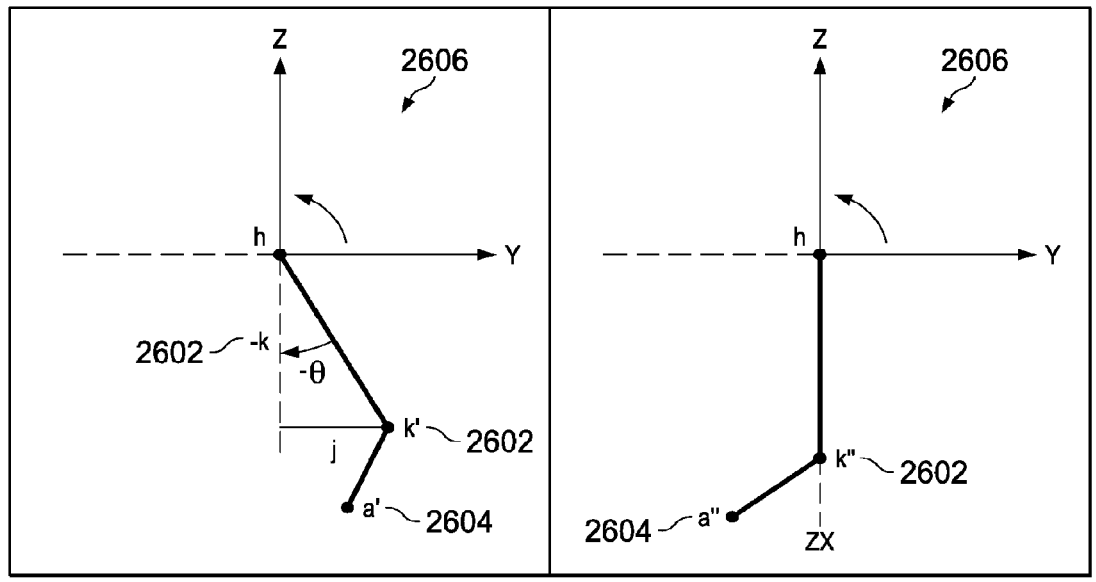
FIG. 26 presents graphs depicting normalization of vectors of associated limbs in accordance with an illustrative embodiment.

FIG. 26 presents graphs depicting normalization of vectors of associated limbs in accordance with an illustrative embodiment. A thigh vector from the transformed knee (k') 2602 to the transformed ankle (a') points 2604 is rotated in the YZ 2606 plane about the X axis to align with the ZX plane. This angle is negated since it is opposite the positive YZ 2606 plane rotation.

Figure 27:
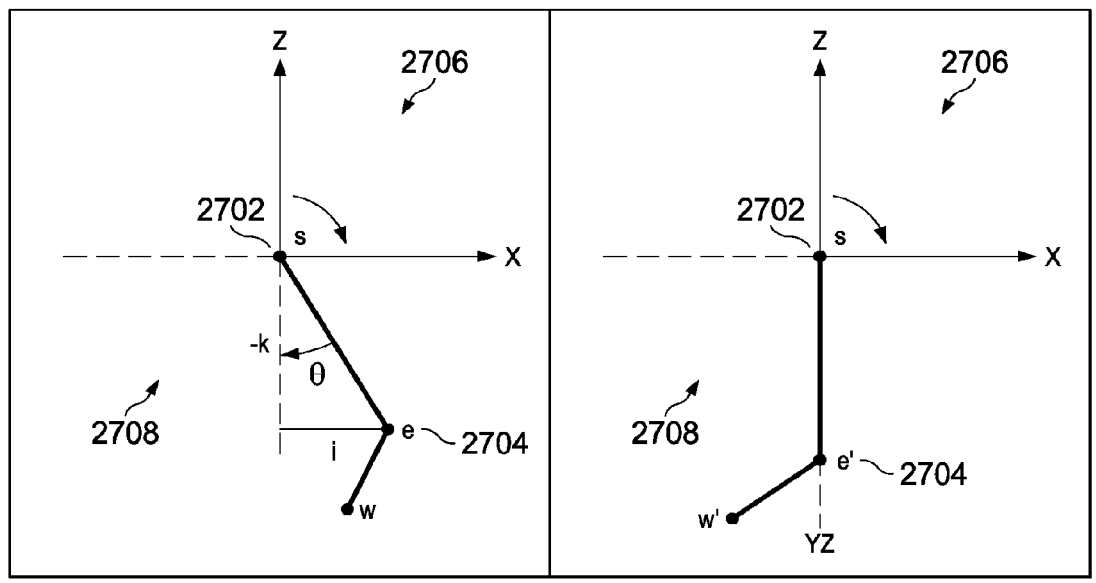
FIG. 27 presents graphs depicting normalization of vectors of associated limbs in accordance with an illustrative embodiment.

FIG. 27 presents graphs depicting normalization of vectors of associated limbs in accordance with an illustrative embodiment. The arm vector from the shoulder (s) 2702 to the elbow (e) 2704 points is rotated in the ZX plane 2706 about the Y axis onto the YZ plane 2708.

Figure 28:
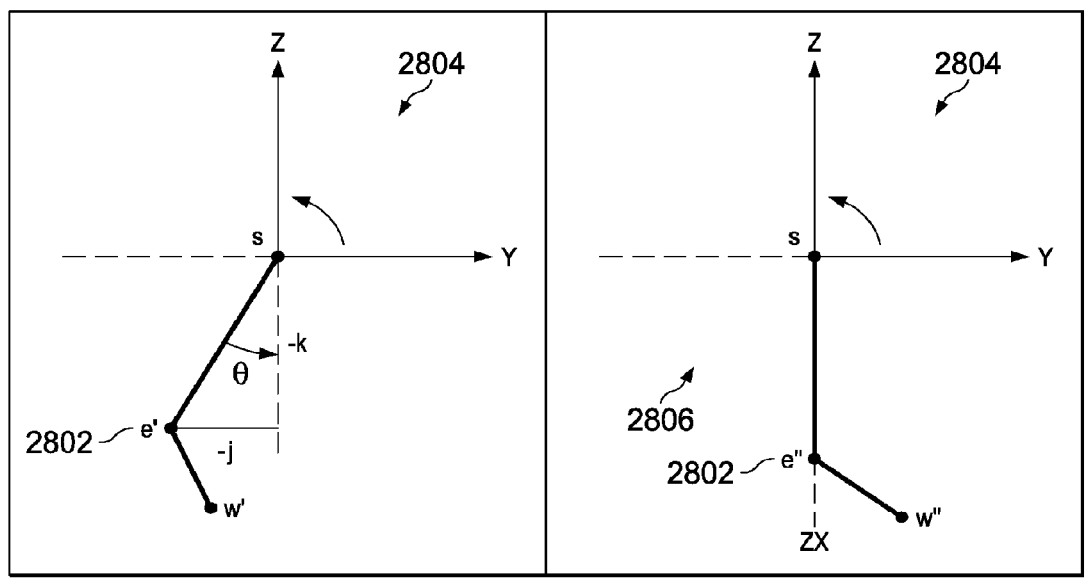
FIG. 28 presents graphs depicting normalization of vectors of associated limbs in accordance with an illustrative embodiment.

FIG. 28 presents graphs depicting normalization of vectors of associated limbs in accordance with an illustrative embodiment. The transformed arm vector from the shoulder to the transformed elbow (e') points 2802 is rotated in the YZ 2804 plane about the X axis to align with the ZX plane 2806.

Figure 29:
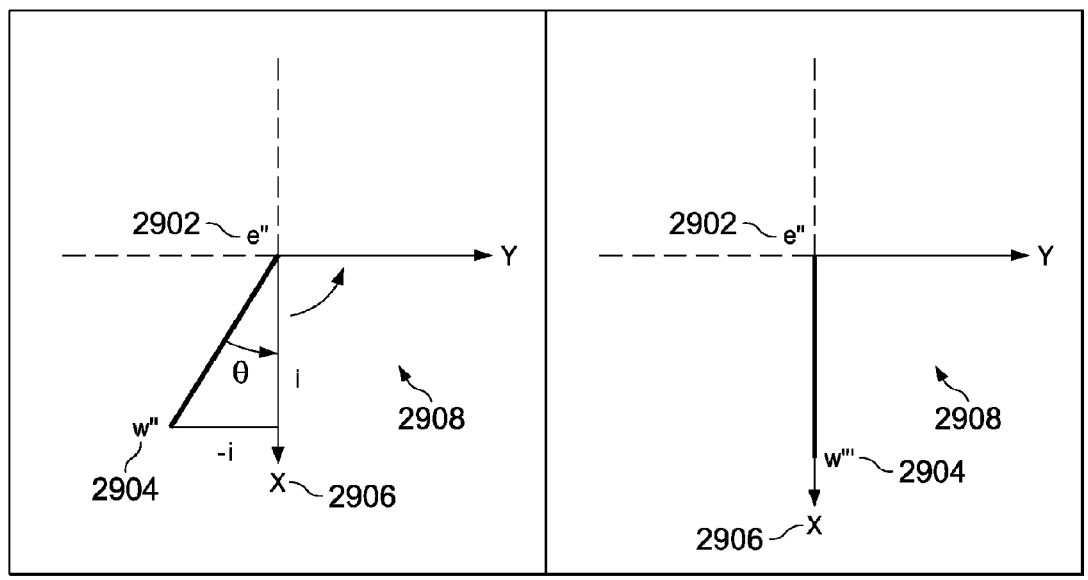
FIG. 29 presents graphs depicting normalization of vectors of associated limbs in accordance with an illustrative embodiment.

FIG. 29 presents graphs depicting normalization of vectors of associated limbs in accordance with an illustrative embodiment. The angle between transformed arm vector from the transformed elbow (e') point 2902 to the transformed wrist (w') point 2904 and the X axis 2906 is computed (which if rotated in the XY plane 2908 about the Z axis to align with the X axis).

Figure 30:
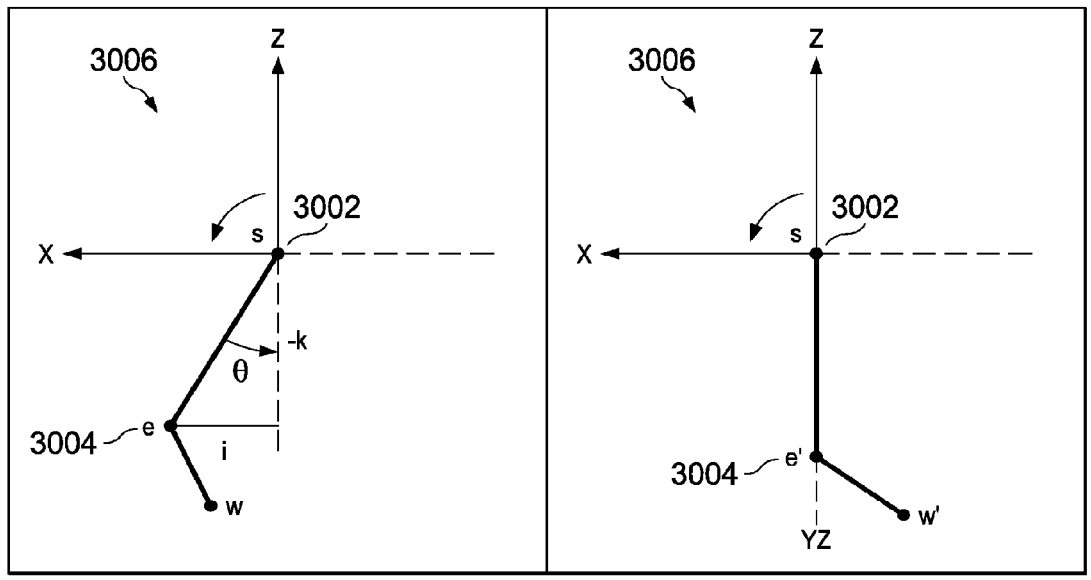
FIG. 30 presents graphs depicting normalization of vectors of associated limbs in accordance with an illustrative embodiment.

FIG. 30 presents graphs depicting normalization of vectors of associated limbs in accordance with an illustrative embodiment. The arm vector from the shoulder (s) 3002 to the elbow (e) points 3004 is rotated in the ZX plane 3006 about the Y axis onto the YZ plane.

Figure 31:
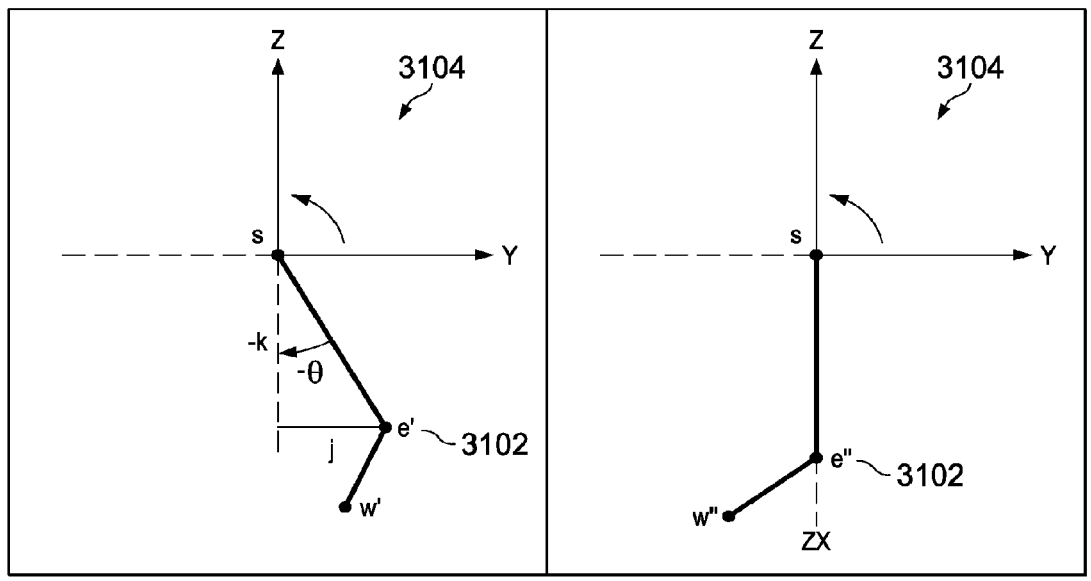
FIG. 31 presents graphs depicting normalization of vectors of associated limbs in accordance with an illustrative embodiment.

FIG. 31 presents graphs depicting normalization of vectors of associated limbs in accordance with an illustrative embodiment. The transformed arm vector from the shoulder to the transformed elbow (e') points 3102 is rotated in the YZ plane 3104 about the X axis to align with the ZX plane. This angle is negated since it is opposite the positive YZ plane rotation.

FIG. 32 presents graphs depicting normalization of vectors of associated limbs in accordance with an illustrative embodiment. The angle between the transformed arm vector from the transformed elbow (e') point 3202 to the transformed wrist (w') point 3204 and the X axis is computed (which if rotated in the XY plane 3206 about the Z axis to align with the X axis). The negation of this angle is used to compute the medial/lateral rotation of the left arm. A pre-computed table of arm angles of computer-aided design system 130 in the XZ and YZ planes may be associated with a normalized arm vector. An entry in this table is in the form <θ, φ, i, j, k> where θ is the ZX angle, φ is the YZ angle and i, j, k are the normalized arm vector components. The ranges on the angles are limits imposed by computer-aided design system 130. The angle increment is one degree. The table only needs to be computed for the right arm since the left arm's vector can be determined from the right arm's vector by negating the j component. An application programming interface for computer-aided design system 130 provides the function Set Value that sets a posture angle for a specified degree of freedom of at least one of a limb 152, limb 154, limb 156, and limb 158 and the functions GetDirectionInGlobal that returns the limb's normalized vector at the degrees of freedom specified.

FIG. 33 is sample lookup table in accordance with an illustrative embodiment. The lookup is performed by computing the skeleton arm segment vector and then iterating through the lookup table and computing the dot product of the arm vector with the pre-computed vector. If the vectors are in the same direction, then the dot product is positive. If they match exactly, the dot product will be one. If the vectors are perpendicular, then the dot product will be zero. If the vectors are opposite in the direction, then the dot product will be negative. These cases are illustrated in FIG. 34 which presents graphs depicting vectors of limbs in accordance with an illustrative embodiment.

An optimal match may be the maximum dot product value (i.e. closest to one). The associated θ and φ angles of the optimal match are used to directly set the arm posture of manikin 150. Algorithms provided herein define a data structure that stores the lookup table's segment vectors and associated degree of freedom angles for the ZX plane and the YZ plane. The lookup table file content is loaded into the data structure when a command is invoked.

Given the skeleton segment vector (xdir) and a desired degree of freedom (dof=0 for ZX plane or 1 for YZ plane), algorithms provided herein iterate through the data structure and compute the dot product of the skeleton arm vector and the pre-computed vector. Algorithms may keep track of the maximum dot product value found to determine the optimal angle.

Turning now to FIG. 35, an illustration of a data processing system is depicted in accordance with an illustrative embodiment. Data processing system 3500 in FIG. 35 is an example of a data processing system that may be used to implement the illustrative embodiments, such as system 100 of FIG. 1, or any other module or system or process disclosed herein. In this illustrative example, data processing system 3500 includes communications fabric 3502, which provides communications between processor unit 3504, memory 3506, persistent storage 3508, communications unit 3510, input/output (I/O) unit 3512, and display 3514.

Processor unit 3504 serves to execute instructions for software that may be loaded into memory 3506. Processor unit 3504 may be a number of processors, a multi-processor core, or some other type of processor, depending on the particular implementation. A number, as used herein with reference to an item, means one or more items. Further, processor unit 3504 may be implemented using a number of heterogeneous processor systems in which a main processor is present with secondary processors on a single chip. As another illustrative example, processor unit 3504 may be a symmetric multi-processor system containing multiple processors of the same type.

Memory 3506 and persistent storage 3508 are examples of storage devices 3516. A storage device is any piece of hardware that is capable of storing information, such as, for example, without limitation, data, program code in functional form, and/or other suitable information either on a temporary basis and/or a permanent basis. Storage devices 3516 may also be referred to as computer readable storage devices in these examples. Memory 3506, in these examples, may be, for example, a random access memory or any other suitable volatile or non-volatile storage device. Persistent storage 3508 may take various forms, depending on the particular implementation.

For example, persistent storage 3508 may contain one or more components or devices. For example, persistent storage 3508 may be a hard drive, a flash memory, a rewritable optical disk, a rewritable magnetic tape, or some combination of the above. The media used by persistent storage 3508 also may be removable. For example, a removable hard drive may be used for persistent storage 3508.

Communications unit 3510, in these examples, provides for communications with other data processing systems or devices. In these examples, communications unit 3510 is a network interface card. Communications unit 3510 may provide communications through the use of either or both physical and wireless communications links.

Input/output (I/O) unit 3512 allows for input and output of data with other devices that may be connected to data processing system 3500. For example, input/output (I/O) unit 3512 may provide a connection for user input through a keyboard, a mouse, and/or some other suitable input device. Further, input/output (I/O) unit 3512 may send output to a printer. Display 3514 provides a mechanism to display information to a user.

Instructions for the operating system, applications, and/or programs may be located in storage devices 3516, which are in communication with processor unit 3504 through communications fabric 3502. In these illustrative examples, the instructions are in a functional form on persistent storage 3508. These instructions may be loaded into memory 3506 for execution by processor unit 3504. The processes of the different embodiments may be performed by processor unit 3504 using computer implemented instructions, which may be located in a memory, such as memory 3506.

These instructions are referred to as program code, computer usable program code, or computer readable program code that may be read and executed by a processor in processor unit 3504. The program code in the different embodiments may be embodied on different physical or computer readable storage media, such as memory 3506 or persistent storage 3508.

Program code 3518 is located in a functional form on computer readable media 3520 that is selectively removable and may be loaded onto or transferred to data processing system 3500 for execution by processor unit 3504. Program code 3518 and computer readable media 3520 form computer program product 3522 in these examples. In one example, computer readable media 3520 may be computer readable storage media 3524 or computer readable signal media 3526. Computer readable storage media 3524 may include, for example, an optical or magnetic disk that is inserted or placed into a drive or other device that is part of persistent storage 3508 for transfer onto a storage device, such as a hard drive, that is part of persistent storage 3508. Computer readable storage media 3524 also may take the form of a persistent storage, such as a hard drive, a thumb drive, or a flash memory, that is connected to data processing system 3500. In some instances, computer readable storage media 3524 may not be removable from data processing system 3500.

Alternatively, program code 3518 may be transferred to data processing system 3500 using computer readable signal media 3526. Computer readable signal media 3526 may be, for example, a propagated data signal containing program code 3518. For example, computer readable signal media 3526 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 3518 may be downloaded over a network to persistent storage 3508 from another device or data processing system through computer readable signal media 3526 for use within data processing system 3500. For instance, program code stored in a computer readable storage medium in a server data processing system may be downloaded over a network from the server to data processing system 3500. The data processing system providing program code 3518 may be a server computer, a client computer, or some other device capable of storing and transmitting program code 3518.

The different components illustrated for data processing system 3500 are not meant to provide architectural limitations to the manner in which different embodiments may be implemented. The different illustrative embodiments may be implemented in a data processing system including components in addition to or in place of those illustrated for data processing system 3500. Other components shown in FIG. 35 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 3504 may take the form of a hardware unit that has circuits that are manufactured or configured for a particular use. This type of hardware may perform operations without needing program code to be loaded into a memory from a storage device to be configured to perform the operations.

For example, when processor unit 3504 takes the form of a hardware unit, processor unit 3504 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, programmable array logic, a field programmable logic array, a field programmable gate array, and other suitable hardware devices. With this type of implementation, program code 3518 may be omitted because the processes for the different embodiments are implemented in a hardware unit.

In still another illustrative example, processor unit 3504 may be implemented using a combination of processors found in computers and hardware units. Processor unit 3504 may have a number of hardware units and a number of processors that are configured to run program code 3518. With this depicted example, some of the processes may be implemented in the number of hardware units, while other processes may be implemented in the number of processors.

As another example, a storage device in data processing system 3500 is any hardware apparatus that may store data. Memory 3506, persistent storage 3508, and computer readable media 3520 are examples of storage devices in a tangible form.

In another example, a bus system may be used to implement communications fabric 3502 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 3506, or a cache, such as found in an interface and memory controller hub that may be present in communications fabric 3502.

Data processing system 3500 may also include associative memory 3528. Associative memory 3528 may be in communication with communications fabric 3502. Associative memory 3528 may also be in communication with, or in some illustrative embodiments, be considered part of storage devices 3516. While one associative memory 3528 is shown, additional associative memories may be present.

In some of the specific, non-limiting embodiments described herein the illustrative embodiments may be performed using WINDOWS® and KINECT® software available from MICROSOFT®, using products available from PRIMESENSE® that may use the OpenNI® open source platform, using DUO® sensing solution available from KICKSTART, INC.®, or using other products.

However, other methods may be used to obtain the skeletal data, as well as other data, used in the illustrative embodiments.

Thus, the illustrative embodiments are not limited to the specific implementations described with respect to the products or solutions mentioned above but rather may use generic systems, methods, and devices as described with respect to FIG. 1, FIG. 2a, and FIG. 2b. In a likewise manner, the illustrative embodiments are not limited to any specific implementations described herein. The illustrative embodiments may be performed using CATIA/DELMIA® software available from Dassault Systemes S.A.®, NX® or JACK AND PROCESS SIMULATE HUMAN® products available from SIEMENS AG®, Pro/Engineer® or Creo® available from PTC, INC.®, or AUTOCAD® available from AUTODESK, INC.®, or other products. Therefore, unless specifically claimed, the claimed inventions should not be read as being limited to these specific embodiments. Nevertheless, unless specifically claimed, the claimed inventions may be read as including these specific embodiments.

Sensing device 140 and other components may employ technologies available from many different manufacturers. While sensing device 140 may be KINECT® software available from MICROSOFT®, products from PRIMESENSE® that may use the OpenNI®open source platform, or DUO® sensing solutions from KICKSTART, INC® may also be used, as noted above. Other solutions or products may be used that are based on structured light imaging technology. Other such providers of structured light imagers that may be used to provide sensing device 140 include MESA IMAGING AG®, OMEK INTERACTIVE, LTD.®, SOFTKINETIC INTERNATIONAL SA/NV®, PMDTECHNOLOGIES GMBH®, and PANASONIC®. Additional providers of structured light imagers include LOGITECH INTERNATIONAL SA® and NAM TAI ELECTRONICS, INC.®, manufacturers of EYE-TOY®.

While structured light imaging technology may be with sensing device 140, embodiments herein also provide for other sensing technologies for use with sensing device 140. For example, time of flight technologies may be used, wherein an amount of time taken for an object or particle, or for an acoustic, electromagnetic, or other wave, to travel a distance through a medium is measured. Products using time of flight technology that may be used with the illustrative embodiments described herein include D-IMAGER® available from PANASONIC CORPORATION®, DEPTH-SENSE® products available from SOFTKINETIC INTERNATIONAL SA/NV®, and products available from FOTONIC® that use complementary metal-oxide-semiconductor sensors provided by CANESTA®. Other such products based on time of flight technology include PMD[VISION]® available from PMDTECHNOLOGIES GMBH®, REAL.IZ 2+3D® available from ODOS IMAGING LIMITED® that may use technology provided by SIEMENS AG®, and SWISSRANGER® products available from MESA IMAGING AG®, which is related to CENTRE SUISSE D'ELECTRONIQUE ET MICROTECHNIQUE, S.A.® (CSEM). Additional products based on time of flight technology may include 3D-MLI SENSOR® available from IEE INTERNATIONAL ELECTRONICS & ENGINEERING S.A.®, TOFCAM STANLEY® available from STANLEY ELECTRIC CO., LTD.®, and products available from TRIDICAM GMBH®. Thus, the claimed inventions described herein are not necessarily limited to any particular illustrative embodiment. Furthermore, the examples described above are non-limiting in the sense that other products and other types of software may be used in conjunction with the illustrative embodiments.

The different illustrative embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non-limiting examples of a computer readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W), and DVD.

Further, a computer usable or computer readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples of modems and network adapters are just a few of the currently available types of communications adapters.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus for positioning structural models and controlling their design environments, comprising:
   a processor;
   a memory in communication with the processor;
   a motion-sensing input device, in communication with the processor, and configured to track a motion of an object and to generate sets of spatial coordinate data for at least one point located on the object, wherein the object is an ergonomic manikin; and
   an application stored in the memory, wherein when the application is executed by the processor the application is configured to:
      receive a first set of spatial coordinate data for the at least one point from the motion-sensing input device; and
      send spatial coordinate data to a computer-aided design system, the computer-aided design system computing angle data to update a design of a model of the object based on the motion of the point located on the object,
   wherein the processor executes a plurality of algorithms that integrate the motion-sensing input device with the computer-aided design system to enable use of a combination of voice commands and body motions, and wherein the voice commands toggle the application between using the body motions to perform skeletal tracking to control the object and using the body motions to move a cursor in a workbench environment of the computer-aided design system to perform functions comprising at least one of pan, zoom, and rotate a perspective view in the workbench environment.

2. The apparatus of claim 1, wherein the point located on the object is a joint on a limb of the ergonomic manikin.

3. The apparatus of claim 2, wherein the application is configured to use a plurality of observations of spatial coordinates generated successively during a period of time, the plurality of observations captured during movements of the limb.

4. The apparatus of claim 2, wherein the application generates skeleton point data from the first set of spatial coordinate data.

5. The apparatus of claim 4, wherein the application computes a limb angle to specify an orientation of the ergonomic manikin from the skeleton point data.

6. The apparatus of claim 5, wherein the limb angle is described by angle specifications in one of three primary planes in a three-dimensional space.

7. The apparatus of claim 6, wherein the angle specifications are defined by the computer-aided design system.

8. The apparatus of claim 5, wherein the computer-aided design system specifies an orientation of the ergonomic manikin based on angles of segments between skeleton points computed by the application.

9. A processor-implemented method for positioning an ergonomic manikin and controlling manikin design environments, comprising:
a computer receiving a set of spatial coordinates from a motion-sensing input device, the spatial coordinates describing a position of at least one joint of a limb of a human model;
the computer sending the set of spatial coordinates to a computer-aided design application, the computer-aided design application representing movements of the ergonomic manikin based on changes in limb angles described by a plurality of instances of angle data;
the computer receiving angle specifications from the computer-aided design application, the angle specifications corresponding to an angle of the limb in at least one three-dimensional plane; and
the computer converting the set of spatial coordinates to angle data in accordance with the angle specifications received from a motion-sensing input device, the angle data describing positioning of the limb,
wherein the computer executes a plurality of algorithms that integrate the motion-sensing input device with the computer-aided design application to enable use of a combination of voice commands and body motions, and wherein the voice commands toggle the computer-aided design application between using the body motions to perform skeletal tracking to control the ergonomic manikin and using the body motions to move a cursor in a workbench environment of the computer-aided design application to perform functions comprising at least one of pan, zoom, and rotate a perspective view in the workbench environment.

10. The method of claim 9, wherein the motion-sensing input device is a depth camera.

11. The method of claim 10, wherein the depth camera is controlled at least by gestures and voice commands.

12. The method of claim 9, wherein the computer executes a plurality of algorithms integrating the motion-sensing input device with the computer-aided design application wherein the plurality of algorithms enable full body tracking and manikin control.

13. The method of claim 12, wherein the plurality of algorithms transform coordinates collected by the motion-sensing input device into coordinate formats used by the computer-aided design application to control at least one of the ergonomic manikin and a development environment.

14. The method of claim 12, wherein the plurality of algorithms resolve incompatibilities between data formats used by the motion-sensing input device and the computer-aided design application.

15. A processor-implemented method of integrating a motion-sensing input device with a computer-aided design application to control an ergonomic manikin, comprising:
a computer receiving three-dimensional x, y, and z coordinates representing positioning of skeletal joints during movements of a human model, the x, y, and z coordinates captured by the motion-sensing input device;
the computer receiving information specifying degrees of freedom describing limb angles in at least one three dimensional plane;
the computer determining at least one limb angle based on the degrees of freedom and the x, y, and z coordinates wherein the at least one limb angle specifies an orientation of the ergonomic manikin; and
the computer providing the at least one limb angle to the computer-aided design application for use in representing movements of the limb,
wherein the computer executes a plurality of algorithms that integrate the motion-sensing input device with the computer-aided design application to enable use of a combination of voice commands and body motions, and wherein the voice commands toggle the computer-aided design application between using the body motions to perform skeletal tracking to control the ergonomic manikin and using the body motions to move a cursor in a workbench environment of the computer-aided design application to perform functions comprising at least one of pan, zoom, and rotate a perspective view in the workbench environment.

16. The method of claim 15, wherein the computer executes a plurality of algorithms that integrate the motion-sensing input device with the computer-aided design application to at least enable positioning of the ergonomic manikin by the computer-aided design application in a same pose taken by the human model and captured by the motion-sensing input device.

17. The method of claim 16, wherein integration of the motion-sensing input device with the computer-aided design application by the plurality of algorithms further enables voice control to rotate the human model relative to an environment of the computer-aided design application.

18. The method of claim 15, wherein the computer executes a plurality of algorithms integrating the motion-sensing input device with the computer-aided design application wherein the plurality of algorithms enable full body tracking and manikin control.

19. The method of claim 15, wherein the plurality of algorithms transform coordinates collected by the motion-sensing input device into coordinate formats used by the computer-aided design application to control at least one of the ergonomic manikin and a development environment.

20. The method of claim 15, wherein the plurality of algorithms resolve incompatibilities between data formats used by the motion-sensing input device and the computer-aided design application.

\* \* \* \* \*